(12) United States Patent
Weber et al.

(10) Patent No.: US 8,650,514 B2
(45) Date of Patent: Feb. 11, 2014

(54) RESCALING

(75) Inventors: Scott J. Weber, Piedmont, CA (US);
Christopher D. Ebeling, San Jose, CA (US); Andrew Caldwell, Santa Clara, CA (US); Steven Teig, Menlo Park, CA (US); Timothy J. Callahan, Mantorville, MN (US); Hung Q. Nguyen, San Jose, CA (US); Shangzhi Sun, San Jose, CA (US); Shilpa V. Yeole, Milpitas, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 13/426,592

(22) Filed: Mar. 21, 2012

(65) Prior Publication Data

US 2012/0176155 A1 Jul. 12, 2012

Related U.S. Application Data

(63) Continuation of application No. PCT/US2011/031482, filed on Apr. 6, 2011.

(60) Provisional application No. 61/357,983, filed on Jun. 23, 2010, provisional application No. 61/415,341, filed on Nov. 18, 2010, provisional application No. 61/454,967, filed on Mar. 21, 2011.

(51) Int. Cl.
*G06F 17/50* (2006.01)

(52) U.S. Cl.
USPC ................................................. 716/101

(58) Field of Classification Search
USPC .............................. 716/100, 101
See application file for complete search history.

(56) References Cited

U.S. PATENT DOCUMENTS

| 7,362,135 B1 | 4/2008 | Chang |
| 7,733,123 B1 | 6/2010 | Young et al. |
| 7,737,740 B2 | 6/2010 | Millar et al. |

(Continued)

FOREIGN PATENT DOCUMENTS

| WO | WO 2007/011203 | 1/2007 |
| WO | WO 2009/002600 | 12/2008 |
| WO | WO 2011/162858 | 12/2011 |

OTHER PUBLICATIONS

International Search Report for PCT/US2011/031482, Jun. 27, 2011, Tabula, Inc.

(Continued)

*Primary Examiner* — Suchin Parihar
(74) *Attorney, Agent, or Firm* — Adeli & Tollen LLP

(57) ABSTRACT

A novel method for designing an integrated circuit ("IC") by rescaling an original set of circuits in a design of the IC is disclosed. The original set of circuits to be rescaled includes sequential nodes, combinational nodes, and interconnects. Each sequential node is associated with a phase of a clock. The method generates a rescaled set of circuits that includes multiple replica sets of the circuits. Each replica set of circuits includes sequential nodes, combinational nodes, and interconnects that are identical to nodes and interconnects in the original set of circuits. Each sequential node is associated with a phase of a clock that is at a fraction of the phase of its corresponding sequential element in the original set. The method connects nodes in each replica set of circuits to a logically equivalent node in another replica set. The method replaces the original set of circuits with the rescaled set of circuits.

26 Claims, 29 Drawing Sheets

(56) References Cited

U.S. PATENT DOCUMENTS

| | | |
|---|---|---|
| 2003/0025564 A1 | 2/2003 | Franca-Neto |
| 2009/0293028 A1* | 11/2009 | Hiraoglu et al. .................. 716/5 |
| 2011/0068858 A1* | 3/2011 | Chawla et al. ................ 327/538 |
| 2013/0097575 A1 | 4/2013 | Weber et al. |

OTHER PUBLICATIONS

Written Opinion for PCT/US2011/031482, Jun. 27, 2011, Tabula, Inc.

International Preliminary Report on Patentability for PCT/US2011/031482, Jan. 10, 2013, Tabula, Inc.

* cited by examiner

RESCALING

CLAIM OF BENEFIT TO PRIOR APPLICATIONS

This application is a continuation application of PCT Application PCT/US2011/031482, entitled "Rescaling," filed on Apr. 6, 2011, now published as WO 2011/162858. PCT Application PCT/US2011/031482 claims the benefit of U.S. Provisional Patent Application 61/357,983, entitled "Rescaling," filed Jun. 23, 2010 and U.S. Provisional Patent Application 61/415,341, entitled "Rescaling," filed Nov. 18, 2010. This application claims the benefit of U.S. Provisional Patent Application 61/454,967, entitled "Rescaling," filed Mar. 21, 2011. U.S. Provisional Patent Applications 61/357,983, 61/415,341, 61/454,967 and PCT Application PCT/US2011/031482, published as WO 2011/162858, are incorporated herein by reference.

BACKGROUND

As a computing device, an integrated circuit (IC) is often evaluated by how fast it can process data. The more data an IC is able to process in a given amount of time, the better performing the IC is generally considered to be. There are several techniques a designer of an IC can employ to increase the performance of an IC from an original design. One of these techniques is to increase the frequency of the clock driving the IC or a particular logic block in the IC. Increased clock speed enables additional data to be processed by having additional clock transitions during the same interval of time.

However, increasing the frequency of the clock has many disadvantages. A higher frequency clock necessarily leads to more signal switching, which leads to higher power consumption and more noise. Even if higher power consumption is acceptable or if a faster performing semiconductor technology is available, the maximum frequency of a clock in the IC is still constrained by the physical limitations of the IC (e.g., propagation delays and parasitic elements). In other words, it is often impossible to achieve a desired performance gain by increasing clock frequency alone.

In order to achieve the desired performance gain without increasing clock speed, an IC designer can use additional areas of the chip to modify a logic block or a subset of the circuits in the IC for parallel processing. For logic blocks with structures that are highly regular (e.g., adders and multipliers), this is a straightforward task of devising repetitive, parallel data paths. For logic blocks with structures that are irregular (e.g., control logic), designing additional circuitry for achieving performance gain (or conversely for reducing clock speed) usually requires a great deal of engineering effort to devise specialized schemes such as breaking logic into pipeline stages. Such methods are usually ad hoc and cannot always retain the functionality and the latency of the original design. Some such methods may also require alteration of the interface between the logic block and the rest of the circuit, adding further complexity to the IC design process.

There is therefore a need for a method that improves the performance of an original design of an IC by using additional circuitry, a method that predictably produces a new design of the IC that retains the functionality, latency, bandwidth and interface of the original design.

SUMMARY

Some embodiments of the invention provide a method for designing an integrated circuit ("IC") by rescaling an original set of circuits in a design of the IC. The original set of circuits to be rescaled includes sequential nodes, combinational nodes, and interconnects. Each sequential node is associated with a phase of a clock. The method generates a rescaled set of circuits that includes multiple replica sets of the circuits. Each replica set of circuits includes sequential nodes, combinational nodes, and interconnects that are identical to nodes and interconnects in the original set of circuits. Each sequential node is associated with a phase of a clock that is at a fraction of the phase of its corresponding sequential element in the original set. The method connects nodes in each replica set of circuits to a logically equivalent node in another replica set. The method replaces the original set of circuits with the rescaled set of circuits.

In some embodiments, the IC for which rescaling is performed is one that includes configurable circuits. The configurable circuits can be configured to perform different functions according to different sets of configuration data. The configurable circuits in some embodiments include configurable logic circuits and configurable interconnect circuits. In some embodiments, some or all of these configurable circuits are run-time reconfigurable circuits. Examples of ICs that include run-time reconfigurable logic circuits and run-time reconfigurable interconnect circuits can be found in U.S. Pat. No. 7,295,037. In some embodiments, the IC implements a user design by running the reconfigurable circuits at a higher clock rate where one user design cycle includes multiple sub-cycles of operations. For some embodiments of the IC that include reconfigurable circuits with sub-cycle operations, a rescaled set of circuits is implemented using a set of reconfigurable circuits in the IC by mapping each fractional phase with a sub-cycle operation of the reconfigurable circuits.

For an original circuit that operates at a first frequency and produces data at a first data rate, a corresponding rescaled circuit in some embodiments operates at a second frequency that is a fraction of the first frequency and produces data at a second data rate that is the same as the first data rate. In some embodiments, the rescaled set of circuits operates at a second frequency that is the same as the first frequency and produces data at a second data rate that is a multiple of the first data rate.

Rescaling in some embodiments is an operation that is undertaken during the design of an IC, in which an original set of circuits in the design is rescaled into a rescaled set of circuits by an IC design tool. In some embodiments, the IC design tool processes parameters of the rescaling operation and performs the rescaling operation according to the rescaling parameters. The rescaling parameters in some embodiments include a rescaling factor, an identification of the set of circuits to be rescaled, and a frequency of the clock driving the rescaled set of circuits.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1:
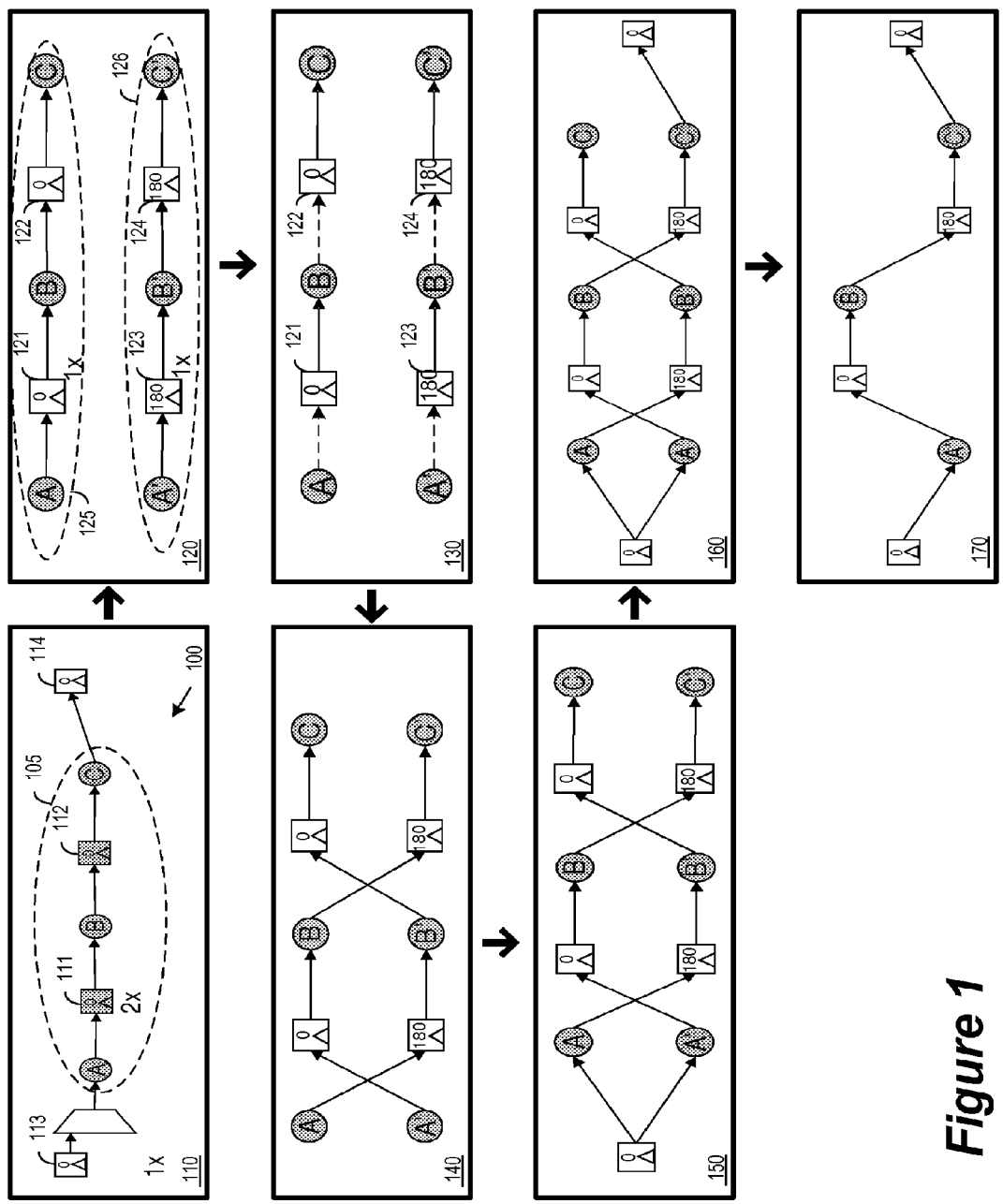
FIG. 1 illustrates a rescaling operation that transforms a subset of a netlist into a rescaled equivalent.

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Rescaling

For a design of an integrated circuit (IC) that includes an original set of circuits designed to operate at a frequency $F_0$, rescaling is an operation that transforms the original set of circuits into a rescaled set of circuits that can operate at a fractional frequency $F_0/k$ and still retain the functionality, latency, bandwidth and interface of the original set of circuits.

Rescaling transforms the original set of circuits into the rescaled set of circuits by making multiple copies of the original set of circuits. A rescaling operation with a rescaling factor of k makes k replicas or copies of the original set of circuits. Each replica set of circuits (or replicas) includes counterpart components and connections that are identical to components and connections in the original set of circuits. Thus for an original set of circuits that includes sequential elements (e.g., flip-flops) and combinational elements (e.g., logic gates and multiplexers), rescaling creates replicas that include counterpart sequential and combinational elements of the sequential and combinational elements of the original.

In some embodiments, the rescaling operation also establishes connections between the replica sets of circuits according to logical equivalency and phase relationships. For an original set of circuits that includes sequential elements operating at certain clock phases, rescaling transforms those clock phases into fractional phases at the counterpart sequential elements in the replicas. The fractional phase $\phi'$ at each sequential element in a replica is thus calculated according to the equation $$\phi'=(\phi+360°\times i)/k \qquad (1),$$

where i is the index of a particular replica (the replicas are indexed as 0 . . . k−1), and $\phi'$ is the fractional phase for a counterpart sequential element in the particular replica set within the rescaled set of circuits.

Based on the calculated fractional phase $\phi'$, some embodiments rewire connections in the rescaled set of circuits such that each sequential element in each replica receives a functional equivalent input at a phase $$\phi'_{input}=\phi'-\Delta(\phi,\phi_{input})/k \qquad (2),$$

where $\phi_{input}$ is the phase of the input to the sequential element before rescaling, and $\Delta(\phi, \phi_{input})$ is the phase difference between the sequential element and its input before rescaling. For a sequential element whose phase difference with its input in the original set of circuits is one entire cycle (i.e., $\Delta(\phi, \phi_{input})=360°$), equation (2) becomes $$\phi'_{input}=(\phi+360°\times(i-1))/k \qquad (3).$$

Since a functional equivalent input at a phase that satisfies equation (3) is often found in another replica set of circuits in the rescaled set of circuits, some embodiments of the rescaling operation rewire some or all sequential elements in a replica to receive inputs from other replicas. Some embodiments also add additional sequential elements into the rescaled netlist in order to provide logically equivalent inputs to sequential elements at correct phase relationships.

The rewiring of the k replicas results in a rescaled set of circuits that has k parallel paths that each has a latency of 1/k cycles of the original set of circuits. In some embodiments, each path runs at a fractional frequency of $F_0/k$ so the effective latency of the k paths is equivalent to the original set. Since there are k parallel paths running at the fractional frequency of $F_0/k$, the effective bandwidth is maintained.

To complete rescaling, some embodiments replace the original set of circuits with the rescaled set of circuits. Replacing the original set with the rescaled set involves disconnecting the original set from certain peripheral nodes and connecting those peripheral nodes to the rescaled set.

The rescaling operation will now be further described by reference to examples illustrated below. In some of these examples, a design of an IC is referred to as a netlist. A netlist in some embodiments is a description of an IC that includes identifications of circuit components and interconnections between the circuit components. An original set of circuits to be rescaled in those examples are sometimes referred to as a subset of the netlist, and a rescaled set of circuits are sometimes referred to as a rescaled subset of the netlist. One of ordinary skill would recognize that a design of an IC could be expressed in forms other than netlists. For example, a design of an IC in some embodiments could be a layout, a mask work, a configuration data set for configuring a FPGA, or any other medium for recording the contents of an IC.

FIG. 1 illustrates seven stages 110-170 of a rescaling operation that transforms a subset 105 of a netlist 100 into a rescaled equivalent. Stage 110 shows the netlist 100 prior to the rescaling transformation. The netlist includes sequential elements 111-114 and combinational elements labeled A, B, and C. Sequential elements 111-112 are illustrated as shaded to indicate that they are running at 2× frequency and are to be rescaled. The use of a 2× frequency clock for running the subset of the netlist to be rescaled is only for the purpose of illustrating that the subset of circuits to be rescaled can be driven by a clock of a different frequency from other circuits in the IC. The use of the 2× frequency clock is also used to illustrate that rescaling can be performed to lower the clock frequency of a subset of a netlist that originally requires a higher clock frequency. In some embodiments, described below by examples in FIGS. 15-17, the frequency of the clock driving the subset can be any frequency, including 1× frequency.

Elements 113-114 running at 1× frequency are not to be rescaled. They are illustrated as unshaded in order to indicate that they are not part of the subset to be rescaled. Sequential element 113 provides the input to the subset of the netlist to be rescaled and is sometimes referred to as an input periphery component. Sequential element 114 receives the output from the subset to be rescaled and is sometimes referred to as an output periphery component.

In the second stage 120, the rescaling operation makes two copies of the subset 105. The first copy 125 (copy 0) includes replica combinational elements A, B, and C, as well as sequential elements 121 and 122. The sequential elements 121 and 122 operate at 1× frequency at 0° phase. The second copy 126 (copy 1) includes replica combinational elements A', B', and C', as well as sequential elements 123 and 124 operating at 1× frequency at 180° phase. The phase of each sequential element is determined by equation (1). For example, sequential element 123 is in the second copy (i=1) of a 2× rescaling operation (k=2), and that sequential element 123 is replicated from the sequential element 111 (φ=0°). Therefore, according to equation (1), the phase φ' of the counterpart sequential element 123 is (0°+360°×1)/2=180°. Sequential elements 121, 122, 123, and 124 are illustrated as unshaded in the second stage 120 to indicate that these sequential elements in the copies of the subset 105 are running 1× frequency instead of 2× frequency.

In the third stage 130, the rescaling operation identifies connections that need to be rewired. Some embodiments identify such connections by examining each sequential element to see if each input of each sequential element comes from a signal source that is at the correct clock phase.

A signal source to the input of a sequential element may come directly or indirectly from another sequential element. A signal that comes directly from a particular sequential element is said to be at the clock phase of the particular sequential element. A signal that comes indirectly from a particular sequential element through one or more combinational elements is also said to be at the clock phase of the particular sequential element. Although combinational elements do not directly receive clock signals, a combinational element that directly or indirectly receives a signal from a particular sequential element is also said to be at the clock phase of the particular sequential element. At stage 130 of this example, combinational nodes B and C are said to be at phase 0° because they are indirectly driven by 0° sequential elements 121 and 122, while combinational nodes B' and C' are said be at phase 180° because they are directly or indirectly driven by 180° sequential elements 123 and 124.

Since all FIG. 1 sequential elements in the original netlist 100 are at 0°, the determination of whether an input is at the correct clock phase is based on equation (3). According to equation (3), (i) the input of sequential element 121 has to come from a combinational element equivalent to A at 180°; (ii) the input of sequential element 122 has to come from a combinational element equivalent to B at 180° phase; (iii) the input of sequential element 123 has to come from a combinational element equivalent to A at 0° phase; and (iv) the input of sequential element 124 has to come from a combinational element equivalent to B at 0° phase. Since the inputs of 121-124 all come from the incorrect clock phase according to equation (3), they are all identified as connections that need to be rewired. The connections to be rewired are illustrated as dashed lines in FIG. 1.

In the fourth stage 140, the rescaling operation rewires sequential elements to receive inputs from equivalent combinational or logic elements at the correct phase. In this example, the needed input for sequential elements of copy 0 can be found in copy 1 and the needed input for sequential elements of copy 1 can be found in copy 0. Some embodiments thus rewire sequential elements to receive input between different copies: sequential element 121 of copy 0 is rewired to logic element A' of copy 1 (at 180°); sequential element 122 of copy 0 is rewired to logic element B' of copy 1 (at 180°); sequential element 123 of copy 1 is rewired to logic element A of copy 0 (at 0°); and sequential element 124 of copy 1 is rewired to logic element B of copy 0 (at) 0°.

In the fifth stage 150, the rescaling operation connects the rescaled subset to the rest of the netlist at the input. In some embodiments, each input of the rescaled subset is connected to an input periphery component with the nearest earlier phase of capture. Here, an earlier phase of capture refers to the clock phase at which an input periphery component captures and provides signal to the input of the rescaled subset. In situations where there are multiple input periphery components (such as input periphery nodes 201 and 202 in FIG. 2), an input periphery component with a nearest earlier phase of capture to an input node is an input periphery component that has a phase that is closest to that input node. In the example of FIG. 1, the sequential element 113 at 0° phase is the only input periphery component providing input to the rescaled subset. The sequential element 113 is therefore necessarily the input periphery component with the nearest earlier phase of capture connecting to both inputs of the subset (at both A and A').

In the sixth stage 160, the rescaling operation connects the rescaled subset to the rest of the netlist at the output. In some embodiments, each output periphery component connects to the rescaled subset at an output node that is at the nearest earlier phase of capture. Here, an earlier phase of capture refers to the clock phase at which an output node in the rescaled set of circuits captures and provides signal to the output periphery component. In situations where there are multiple output nodes in a rescaled subset, an output node with a nearest earlier phase of capture to the output periphery component is an output node that has a phase that is closest to that output periphery component. In the example of FIG. 1, the output periphery component is the sequential element 114 at 0° phase. Output node C of the rescaled subset is at the previous 0° phase, which is 360° earlier than the output periphery component 114. Output node C" of the rescaled subset is at 180° phase, which is 180° earlier than the output periphery component 114. Thus, output node C" has a phase that is nearer to the phase of the output periphery component 114 than output node C. The output periphery component 114 is thus connected to output node C" rather than output node C since C" is the output node at the nearest earlier phase of capture.

In the seventh stage 170, the rescaling operation optimizes the rescaled netlist by trimming off nodes that are not needed for output. In this example, since node C is not connected to any output, and therefore not needed, the components that do not feed any output node other than node C are also not needed, including sequential element 122, node B', sequential element 123, and node A. In some embodiments, these unneeded components are trimmed off and removed from the netlist to save power and area.

In the example illustrated in FIG. 1, the rescaling operation is able to find a functional equivalent input at the correct fractional phase from one of the copies of the subset for all sequential elements in the rescaled netlist. However, there are netlists in which one or more sequential elements cannot find a functional equivalent input from one of the copies in the rescaled netlist when rescaling is applied. In these instances, some embodiments insert additional sequential elements to the netlist to provide the functional equivalent input. For example, a netlist may have a component that is temporally shared (e.g., used in multiple contexts). Some embodiments resolve this by replicating the component so each replica component is used in a single context. In other examples, a netlist may have a connection from one sequential element through a combinational or logic element to another sequential element that crosses 0° phase implicitly. Some embodiments resolve such crossing by inserting an explicit 0° sequential element which does not change the functionality.

Figure 2A:
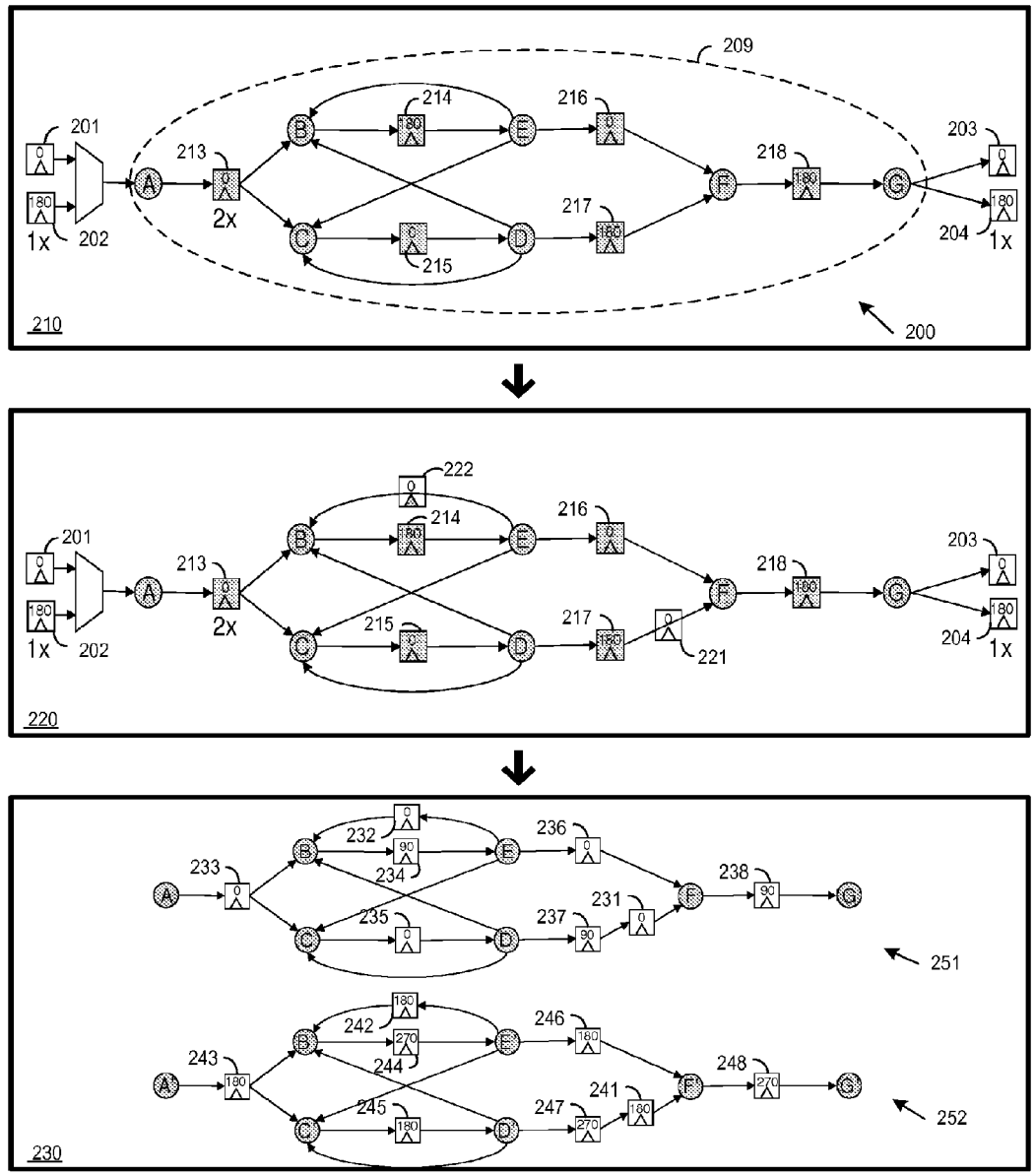
FIGS. 2a-c illustrate a rescaling operation for a netlist that includes implicit 0° crossings.
Figure 2B:
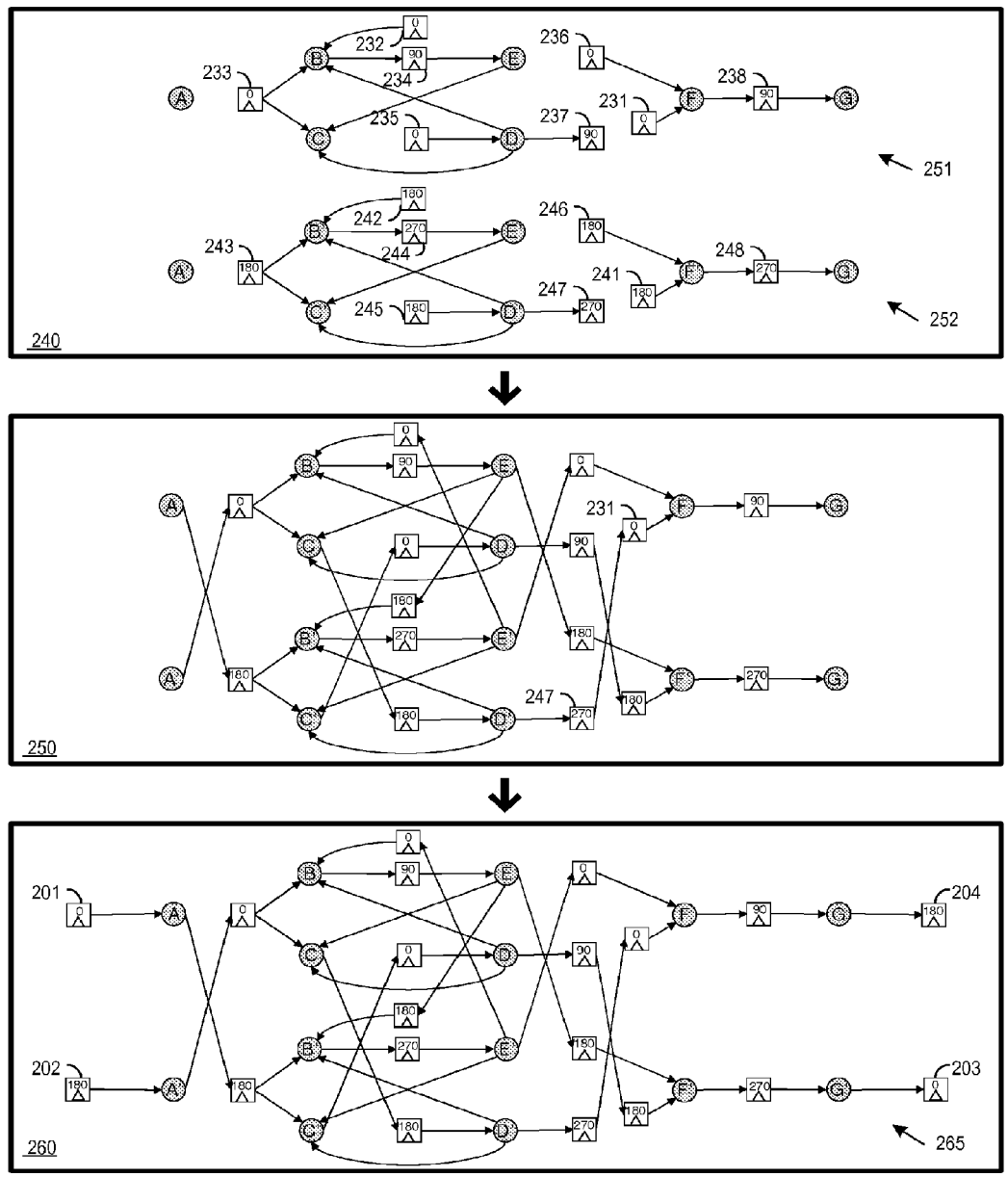

For some embodiments, FIGS. 2a and 2b illustrate a rescaling operation for a netlist 200 that includes implicit 0° crossings. The rescaling operation will be described in six stages 210 to 260. The first stage 210 shows the netlist 200 before the rescaling operation. As illustrated, the netlist 200 includes sequential elements 201-204 (not shaded) running at 1× frequency, where sequential elements 201 and 203 are at 0°, and sequential elements 202 and 204 are at 180°. The netlist also includes a subset 209 of the netlist that is to be rescaled. The subset 209 includes sequential elements 213-218 running at 2× frequency, with elements 213, 215, and 216 at 0°, and elements 214, 217, and 218 at 180°. As mentioned above, the 2× clock frequency shown as driving the subset 209 is for illustration only. In some embodiments, the subset of the circuit that is to be rescaled is not required to operate under any particular frequency. The subset 209 also includes logical/combinational elements labeled A, B, C, D, E, F, and G. The connection from 217 at 180° to 218 at 180° implicitly crosses 0°. The feedback path from 214 at 180° to E, then to B, and then back to 214 at 180°, also implicitly crosses 0°.

At the second stage 220, explicit 0° sequential elements are inserted to resolve implicit 0° crossings. Some embodiments insert functionally equivalent sequential elements at 0° into signal paths that implicitly cross 0° (e.g., crossing 0° from 270° to 90°). In the example illustrated, sequential element 222 at 0° of the 2× frequency clock is inserted into the path from combinational element E to combinational element B (crossing 0° from 180° to 180°). Likewise, sequential element 221 at 0° of the 2× frequency clock is inserted into the path between sequential element 217 and combinational element F (crossing 0° from 180° to 180°). Neither of the inserted sequential elements affects the functionality of the netlist 200.

At the third stage 230, the combinational elements A-G, the sequential elements 213-218, and the inserted 0° explicit sequential elements 221 and 222 are replicated into two copies 251 and 252 of the subset 209. Both copies run on the 1× frequency clock. The first copy 251 includes combinational elements A-G and sequential elements 231-238. The second copy 252 includes combinational elements A'-G' and sequential elements 241-248. In some embodiments, the phase of each sequential element is determined by equation (1). For example, sequential element 244 is in the second copy (i=1) of a 2× rescaling operation (k=2), and that sequential element 244 is replicated from the sequential element 214 ($\phi$=180°). The phase of sequential element 244 is therefore (180°+360°×1)/2=270° according to equation (1).

At the fourth stage 240, the rescaling operation identifies the connections that need to be rewired. In this example, input connections to replica sequential elements 231, 232, 235, 236, 241, 242, 245, and 246 are identified as not coming from the correct phase and, thus, need to be rewired. In some embodiments, equation (2) determines whether the input connection to a sequential element has the correct phase. For example, replica sequential element 231 at 0° ($\phi'$=0° is replicated from sequential element 221 at 0° ($\phi$=0°). The input to sequential element 221 is sequential element 217, which is at 180°. The difference in phase between sequential element 221 and its input is thus 180° ($\Delta(\phi-\phi_{input})$=360°−180°=180°). The correct input phase to the replica sequential element 231 (replicated from sequential element 221) is therefore 360°−180°/2=270°, according to equation (2). However, since the original input connection of element 231 is not 270° (sequential element 237 is at phase 90° instead of 270°), some embodiments identify this connection as one of the connections that needs to be rewired.

At the fifth stage 250, the rescaling operation rewires sequential elements to receive input from equivalent logic elements at the correct phase. For example, sequential element 231 requires input from equivalent combinational element D at 270° phase as mentioned earlier. Some embodiments rewire input to sequential element 231 to receive input from replica sequential element 247, which provides an equivalent signal of combinational element D at phase 270°. Inputs to sequential elements 231, 232, 236, 241, 242, and 246 are likewise rewired to receive logically equivalent inputs at correct phases.

At the sixth stage 260, the rescaling operation connects the rescaled subset of the netlist to the rest of the IC to create the rescaled circuit 265. In some embodiments, each input of the rescaled subset is connected to an input periphery component with the nearest earlier phase of capture. In this example, the sequential element 233 has phase of 0° (or 360°), and the input periphery component with the nearest earlier phase of capture is 202, which is at phase 180°. The sequential element 243 has phase of 180°, and the input periphery component with the nearest earlier phase of capture is 201, which is at phase 0°.

In some embodiments, each output periphery component connects to the rescaled subset at an output node that is at the nearest earlier phase of capture. In this example, the output periphery component 203 is at 0° (or 360°) phase. Thus, the output node in the rescaled subset at the nearest earlier phase of capture is G', which is at phase 270° Likewise, the output periphery component 204 is at 180', and the output node in the rescaled subset at the nearest earlier phase of capture is G, which is at phase 90°.

Figure 2C:
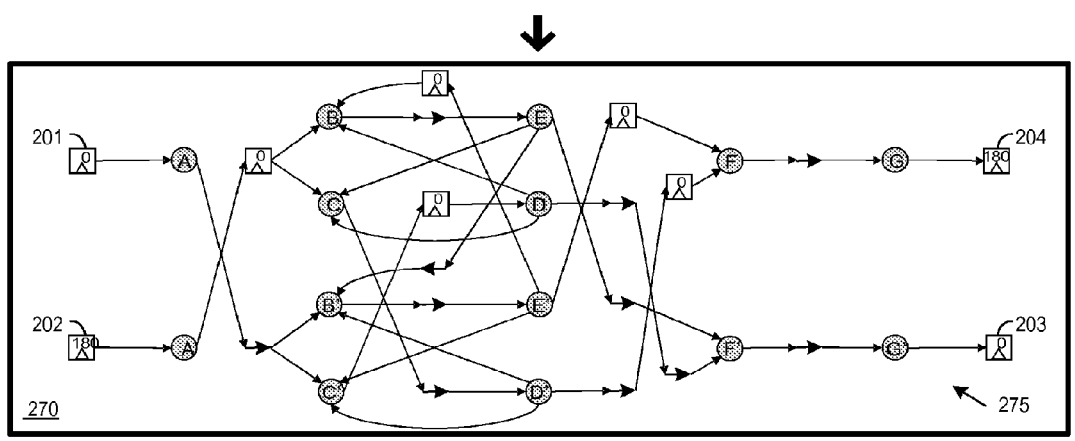

In some embodiments, optimization trims off all sequential nodes in the rescaled netlist that are neither (i) zero-degree sequential nodes, nor (ii) input or output nodes. Some embodiments replace a sequential node trimmed off by this optimization operation with a logical wire. In some embodiments, the optimized netlist is logically equivalent to the original or the rescaled netlist because explicit zero degree flops have been inserted in the existing implicit zero degree crossings (e.g., the insertion of explicit zero degree sequential element 221 during stage 220 of FIG. 2*a*). FIG. 2*c* illustrates an additional optimization stage 270 in which the rescaled circuit 265 is further optimized to become an optimized circuit 275. In the optimized circuit 275, a logical wire replaces each non-zero degree sequential element. Specifically, logical wires replace: (i) 90° sequential elements 234, 237, and 238; (ii) 180° sequential elements 243, 242, 245, 246, and 241; and (iii) 270° sequential elements 244, 247, and 248.

Though not illustrated in FIGS. 2*a*-*c*, some embodiments perform a further step of optimization after the seventh stage 270. The further optimization step, in some embodiments, trims off nodes in the netlist that do not lead to any output. In the example of FIG. 2, since all combinational elements and all sequential elements in the rescaled netlist lead to at least one output (either 203 or 204), none of the elements are trimmed off during optimization.

Figure 3A:
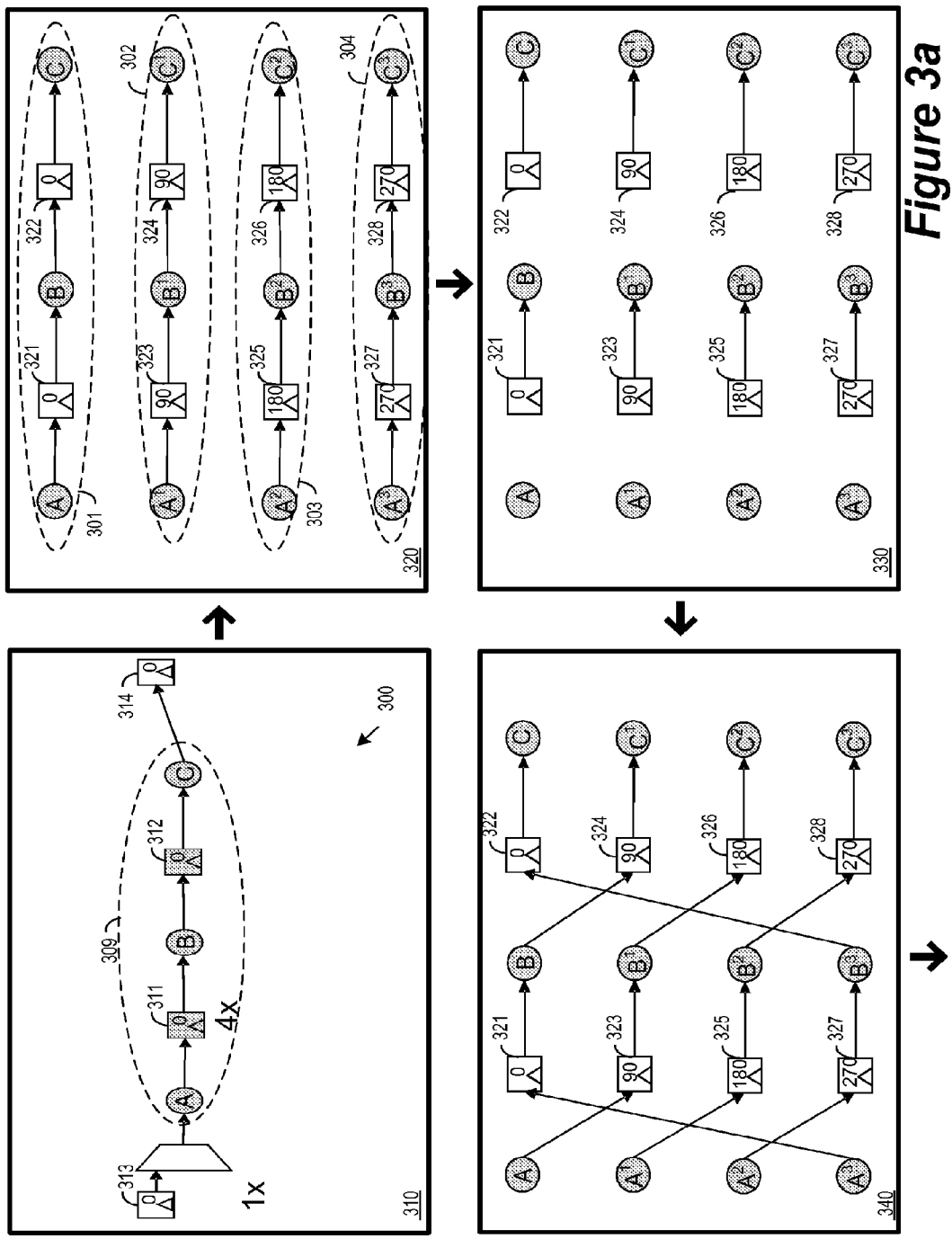
FIGS. 3a-b illustrate an example in which a subset of the netlist is rescaled by a factor of four (k=4) so the rescaled netlist can run at a quarter of the frequency.
Figure 3B:
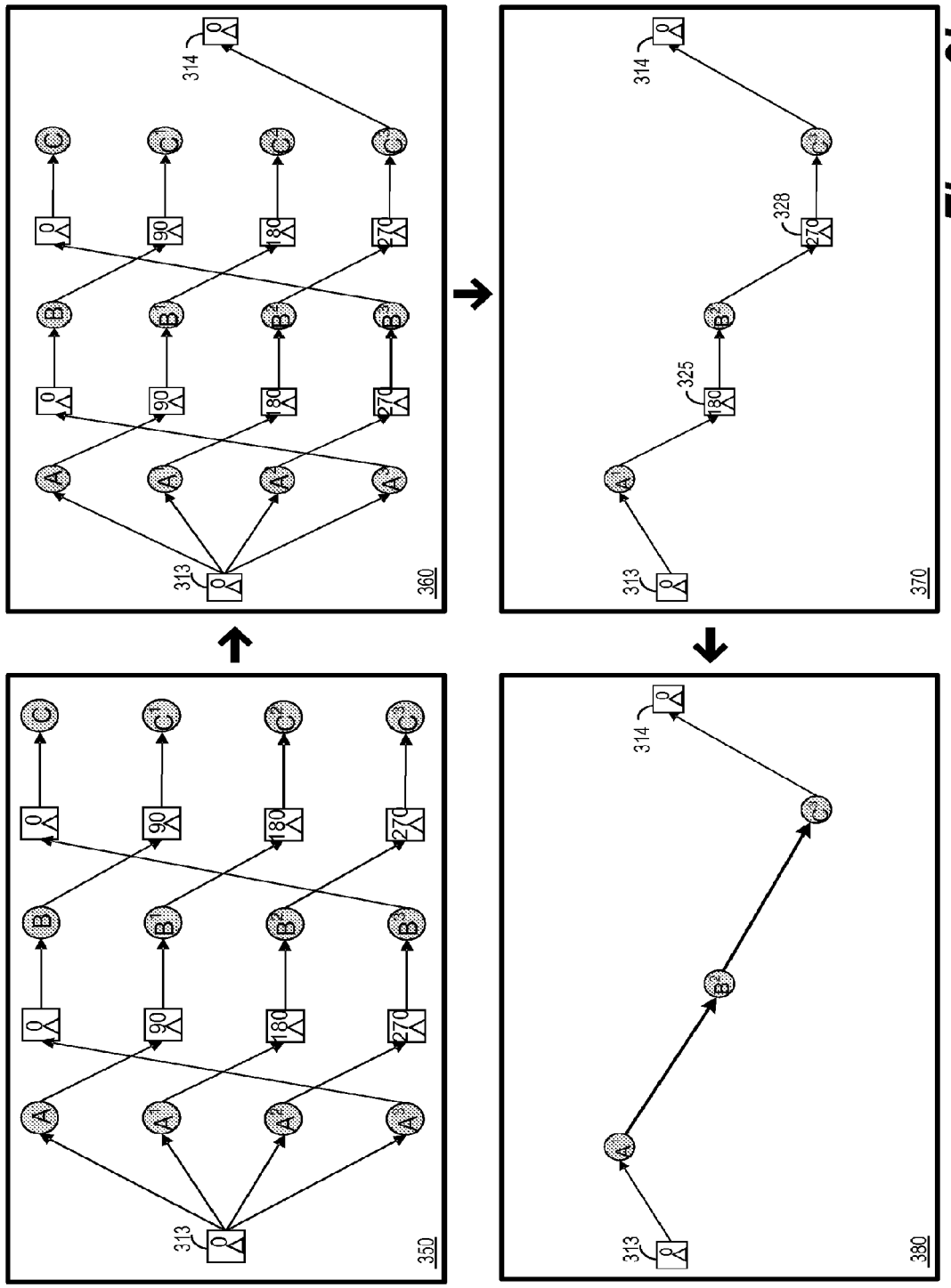

The examples illustrated in FIGS. 1 and 2*a*-*b* rescale a subset of a netlist by a factor of 2 (k=2) so the rescaled netlist can run at half the frequency. In some embodiments, the rescaling operation can be performed at any integer factor. FIGS. 3*a*-*b* illustrate an example in which a subset of the netlist is rescaled by a factor of four (k=4) so the rescaled netlist can run at a quarter of the frequency. FIGS. 3*a*-*b* illustrate the rescaling operation in eight stages 310-380.

The first stage 310 shows the netlist 300 before the rescaling operation. As illustrated, the netlist 300 includes sequential elements 311-314. The netlist 300 also includes combinational elements labeled A, B, and C. Sequential elements 311 and 312 are running at 4× frequency and, along with combinational elements A, B, and C, are to be rescaled as part of the subset 309. Sequential elements 313 and 314 are running at 1× frequency and serve as input and output periphery components for the subset of the netlist to be rescaled. In this example, sequential elements 313 and 314 are at phase 0° of the 1× frequency clock, and sequential elements 311 and 312 are at phase 0° of the 4× frequency clock.

At the second stage 320, the subset to be rescaled is replicated into four copies 301-304. All four copies run on the 1× frequency clock. Each of the four copies includes logical equivalents of combinational elements A-C, and counterparts of sequential elements 311 and 312. (A-C and 321-322 in copy 301, $A^1$-$C^1$ and 323-324 in copy 302, $A^2$-$C^2$ and 325-326 in copy 303, and $A^3$-$C^3$ and 327-328 in copy 304.) In some embodiments, the phase of each sequential element is determined by equation (1). For example, sequential element 327 is in the fourth copy (i=3) of a 4× rescaling operation (k=4), and that sequential element 327 is replicated from the sequential element 311 ($\phi$=0°). Therefore, according to equation (1), the phase of sequential element 327 is (0°+360°×3)/4=270°.

At the third stage 330, the rescaling operation identifies the connections that need to be rewired. In this example, input connections to sequential elements 321-328 are all identified as not coming from the correct phase and thus need to be rewired. In some embodiments, whether the input connection to a sequential element has the correct phase is determined by equation (2). For example, the sequential element 326 in the rescaled netlist is at 180° ($\phi'$=180°), and that sequential element 326 is replicated from the sequential element 312 at 0° ($\phi$=0° or 360°). The input to sequential element 312 is at 0°. Thus the difference in phase between sequential element 312 and its input is 360° ($\Delta(\phi-\phi_{input})$=360°-0°=360°). Therefore, according to equation (2), the correct input phase to the sequential element 326 is 180°-360°/4=90°. Since the original input connection of the sequential element 326 is not 90° (325 is at phase 180° instead of 90°), some embodiments identify this connection as one of the connections that needs to be rewired.

At the fourth stage 340, the rescaling operation rewires sequential elements to receive input from equivalent logic elements at the correct phases. For example, since sequential element 312 receives input from combinational element B, the sequential element 326 in the rescaled netlist has to receive input from an equivalent of combinational element B. As mentioned earlier, sequential element 326 requires input at 90° phase. Accordingly, some embodiments rewire input to sequential element 326 to receive input from the equivalent of combinational element B at phase 90°. In the example illustrated, the output of combinational element $B^1$ following sequential element 323 is at phase 90°. Thus, some embodiments rewire the input of sequential element 326 to come from element $B^1$.

At the fifth stage 350, the rescaling operation connects the rescaled subset to the rest of the netlist at the input. In some embodiments, each input of the rescaled subset is connected to an input periphery component with the nearest earlier phase of capture. In this example, since sequential element 313 at 0° phase is the only input periphery component providing input to the rescaled subset, it is used to provide input to combinational elements A, $A^1$, $A^2$, and $A^3$.

At the sixth stage 360, the rescaling operation connects the rescaled subset to the rest of the netlist at the output. In some embodiments, each output periphery component connects to the rescaled subset at an output node that is at the nearest earlier phase of capture. In this example, the output periphery component 314 is at 0° phase, and thus, output node $C^3$ after sequential element 328 at 270° has the nearest earlier phase of capture. Thus, some embodiments connect combinational element C after sequential element 328 as the output of the resealed subset.

At the seventh stage 370, the rescaling operation optimizes the rescaled netlist by trimming off nodes that are not needed for output. In this example, since node $C^3$ following sequential element 328 is the only node that connects to an output, all nodes in the rescaled netlist that do not directly or indirectly feed node $C^3$ can be trimmed off.

The eighth stage 380 illustrates an additional optimization stage, in which some embodiments perform a further optimization by eliminating all sequential nodes in the rescaled netlist that are neither (i) zero-degree sequential nodes, nor (ii) input or output nodes. In the example of FIG. 3*b*, sequential elements 325 (180°) and 328 (270°) are both replaced by wires, resulting in a rescaled netlist in which node $A^1$ directly connects $B^2$ logically, and $B^2$ directly connects $C^3$ logically, without any intermediate sequential elements.

The example netlist illustrated in FIGS. 3*a*-*b* has only one input at one phase and only one output at one phase at the periphery of the rescaled subset of the netlist. Other netlists, such as the netlist 200 in FIG. 2*a*, have multiple input ports driving the same input node at different phases, and have multiple output ports at different phases receiving signals from the same output node. In these instances, each additional input/output periphery component would connect to an input/output node at the nearest later/earlier phase of capture. For example, if the netlist 300 has an additional output periphery component connected to node C at phase 180°, the rescaling operation in some embodiments would connect the additional 180° output periphery component to node $C^1$ at 90° and would not trim off the paths leading to node $C^1$.

Figure 4:
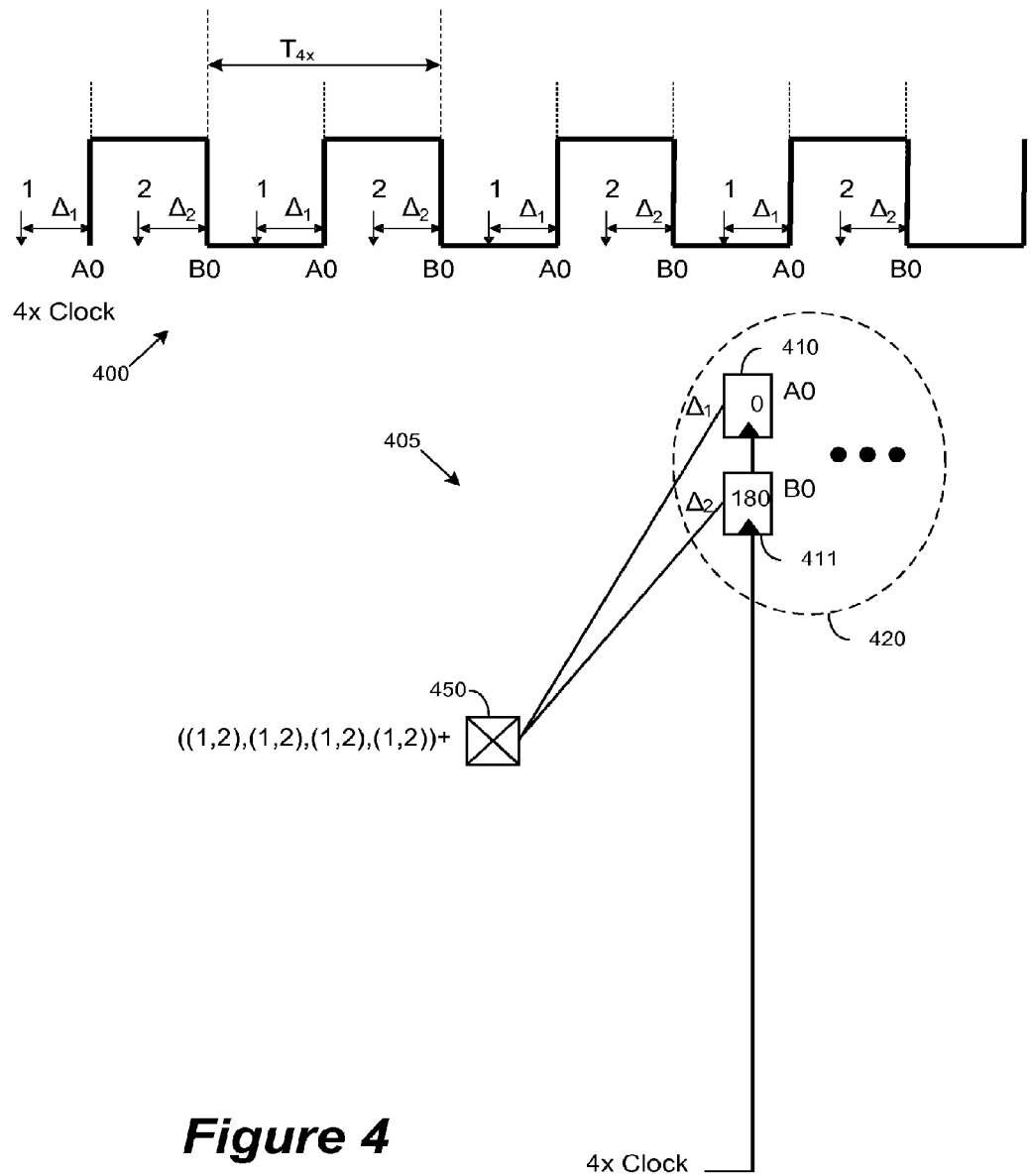
FIGS. 4-5 illustrate connecting a rescaled subset of a circuit to an output interface node of a memory or I/O.
Figure 5:
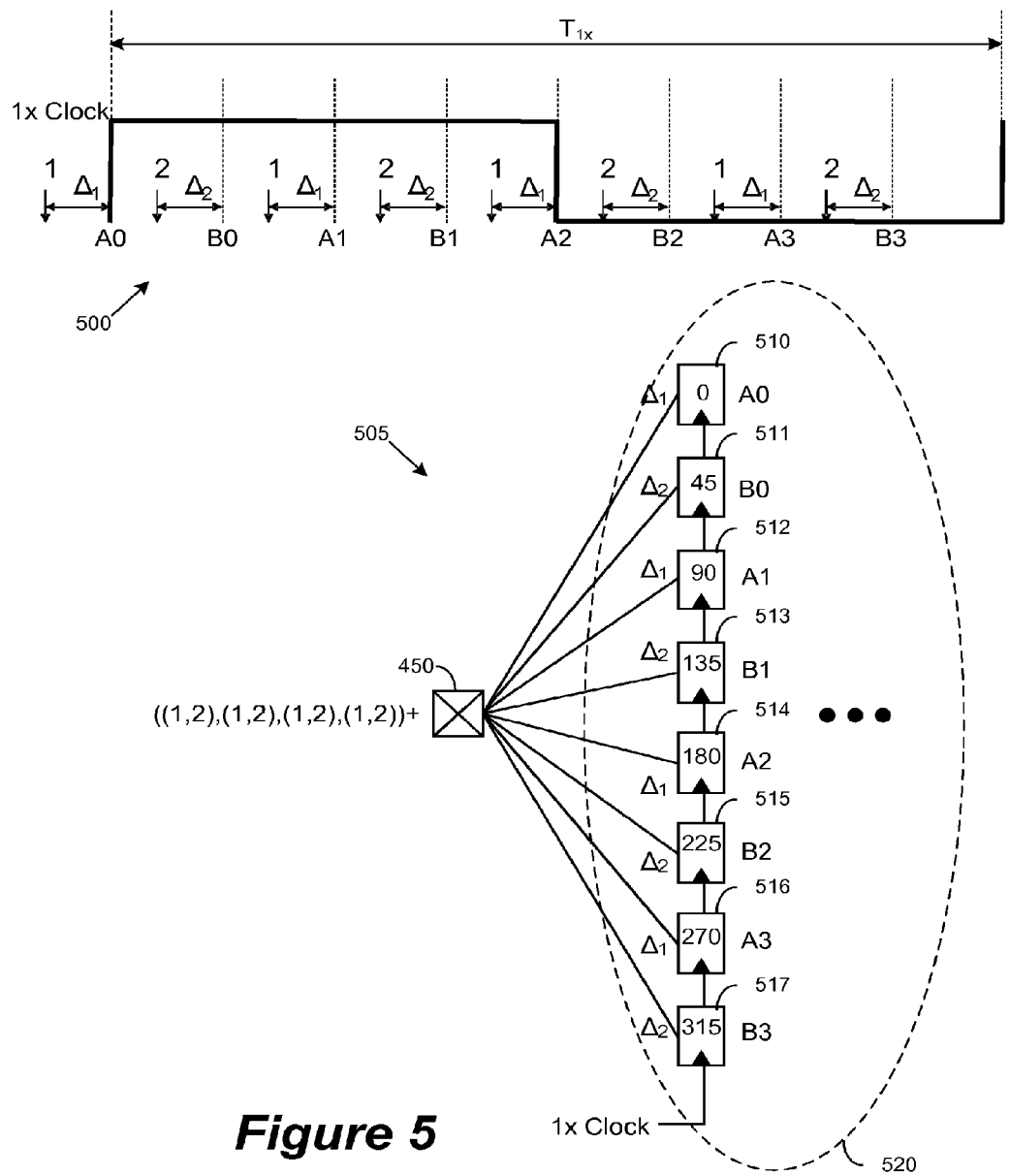
Figure 6:
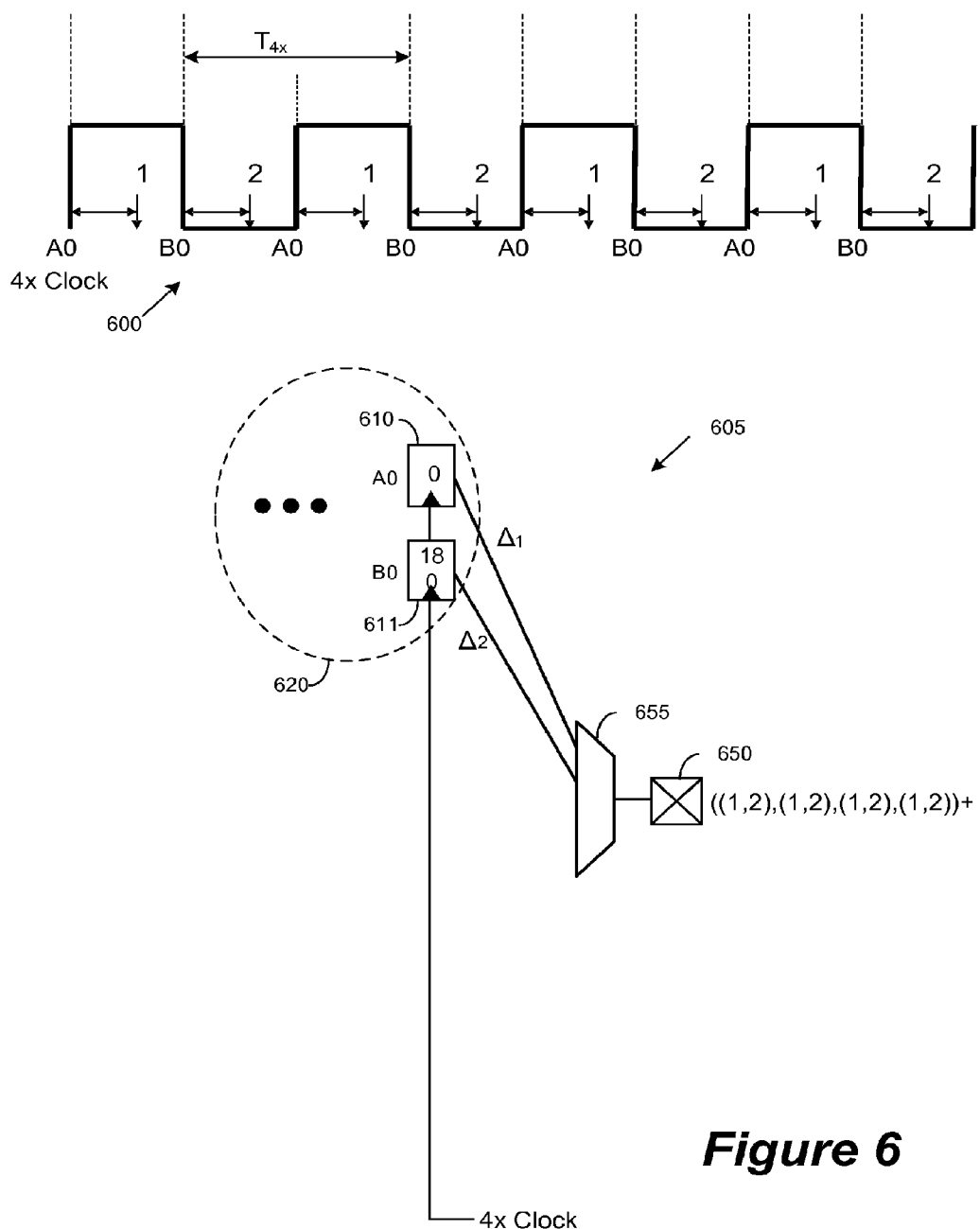
FIGS. 6-7 illustrate connecting a rescaled subset of a circuit to an input interface node of a memory or I/O.
Figure 7:
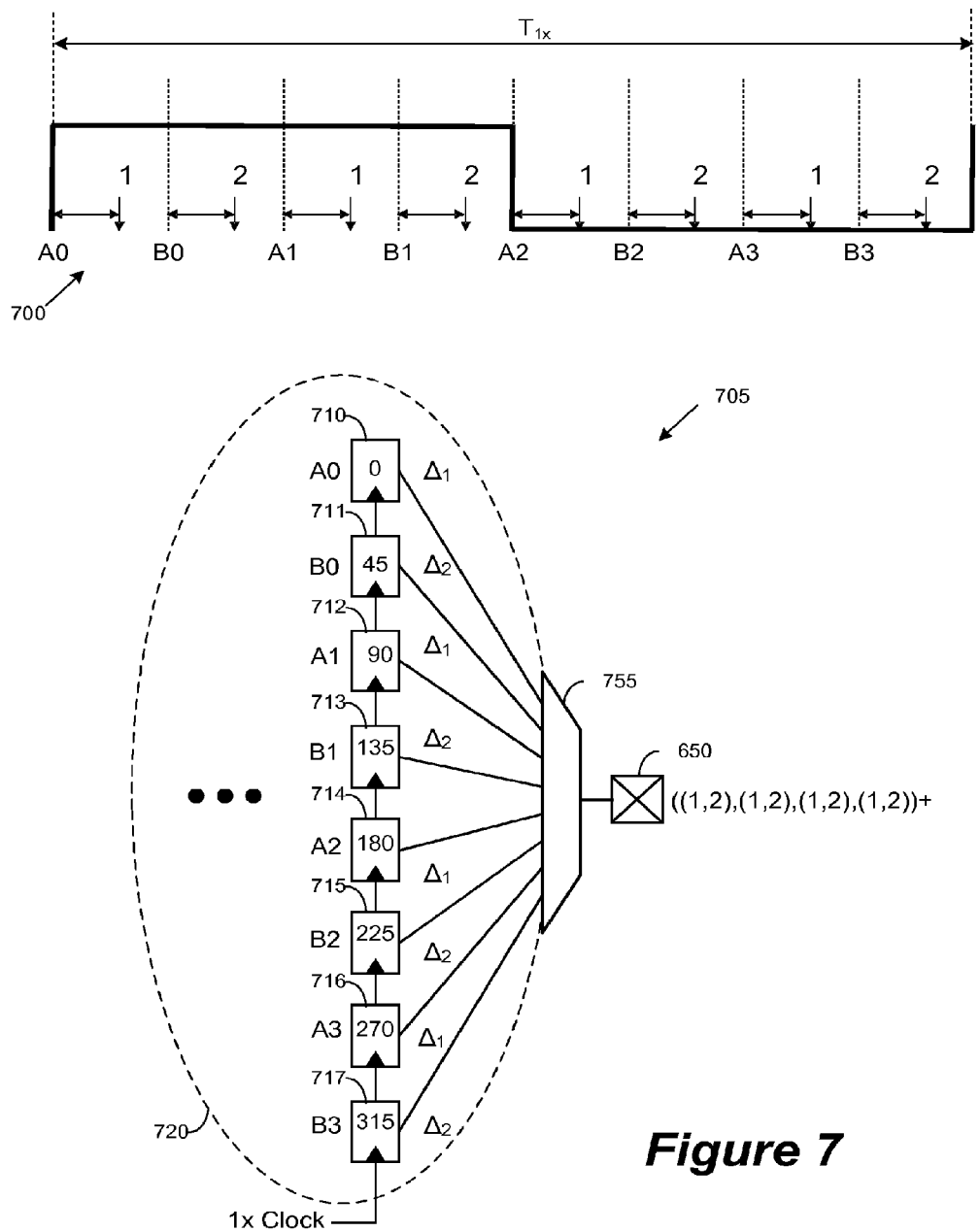

In the rescaling operation examples illustrated above, the netlist subsets (i.e., 105, 209 and 309), transformed by the rescaling operation, are connected to the rest of the netlist by clock driven sequential elements such as flip-flops. In other words, the input and output periphery components in these examples (i.e., 113, 114, 201, 202, 203, 204, 313, and 314) sample data at precise clock edges. In some embodiments, the rescaling operation described above can also be performed on memory interfaces and I/O boundaries. Unlike flip-flops that sample or provide data at precise clock edges, memory interfaces and I/O boundaries often specify timing delays for sampling or providing data at a particular interface node. For some of these embodiments, connecting an input/output node to the nearest later/earliest phase of capture entails connecting sequential elements at different clock phases to the interface node according to the timing delay or timing requirements of the interface node. FIGS. 4-5 illustrate connecting a rescaled subset of a circuit to an output interface node of a memory or I/O, while FIGS. 6-7 illustrate connecting a rescaled subset of a circuit to an input interface node of a memory or I/O.

For some embodiments, FIGS. 4-5 illustrate two stages of an example 4× rescaling operation for a circuit 405 that receives data from an output interface node 450 of a memory interface or I/O boundary. FIG. 4 illustrates the stage before the rescaling operation while FIG. 5 illustrates the stage after the rescaling operation. As illustrated, FIG. 4 includes a waveform 400 and a corresponding circuit 405 for before the 4× rescaling operation. The circuit 405 includes an original subset 420 that is connected to an I/O or memory interface node 450. The interface node 450 connects the original subset 420 at sequential elements 410 and 411, which are both driven by a fast 4× clock (at 4× frequency).

The waveform 400 shows the timing relationships between the data provided at the interface node 450 and the 4× clock. During each period $T_{4\times}$ of the 4× clock, the interface node 450 provides two sets of data ('1' and '2') that are denoted by the notation (1, 2). Data set '1' is specified to be available at a timing delay $\Delta_1$ before the rising edge (sampling time $\Delta 0$) of the 4× clock. Data set '2' is specified to be available at a timing delay $A_2$ before the falling edge (sampling time B0) of the 4× clock. Correspondingly, the sequential element 410 in the original subset 420 is a flip-flop that samples data set '1' at 0° phase (rising edge) of the 4× clock, while the sequential element 411 is a flip-flop that samples data set '2' at 180° phase (falling edge).

The example rescaling operation has a rescaling factor of 4 and rescales the original subset 420 that operates using the 4× clock into a rescaled subset that operates using a slower 1× clock (at 1× frequency or at ¼ the frequency of the 4× clock). FIG. 5 illustrates a waveform 500 and a corresponding rescaled circuit 505 that has been rescaled by the 4× rescaling operation. The rescaled circuit 505 includes a rescaled subset 520 that is connected to the interface node 450. The interface node 450 connects the rescaled subset 520 at eight sequential elements 510-517 that are driven by the 1× clock.

The waveform 500 shows the timing relationship between the data provided at the interface node 450 and the 1× clock. Since the rescaling operation is transparent to circuits outside the rescaled subset, the interface node 450 still provides two sets of data for each $T_{4\times}$ period, which result in eight sets of data for each period $T_{1\times}$ of the 1× clock. These eight data sets are denoted by four (1, 2) pairs in FIG. 5. Each of the eight data sets arrives at one of the eight sequential elements 510-517. Each sequential element is at one of the eight fractional phases of the 1× clock (i.e., 0°, 45°, 90°, 135°, 180°, 225°, 270°, and 315°), which correspond to eight different sampling times (A0, B0, A1, B1, A2, B2, A3, and B3). The eight different sampling times in the $T_{1\times}$ period also correspond to the rising and falling edges of the 4× clock.

Data sets marked as '1' are specified to be available at a timing delay $A_1$ before the rising edge of the 4× clock (i.e., at $A_1$ before the sampling times A0, A1, A2, and A3). Data sets marked as '2' are specified to be available at a timing delay $\Delta_2$ before the falling edge of the 4× clock (i.e., at $\Delta_2$ before the sampling times B0, B1, B2, and B3). As sampling times A0, B0, A1, B1, A2, B2, A3, and B3 correspond to the sampling times of the eight fractional phase sequential elements 510-517, both the data sets marked as '1' and the data sets marked as '2' enter the rescaled subset 520, which operates using the slower 1× clock.

For some embodiments, FIGS. 6-7 illustrate two stages of an example 4× rescaling operation for a circuit 605 that supplies data to an input interface node 650 of a memory interface or I/O boundary. FIG. 6 illustrates the stage before the rescaling operation while FIG. 7 illustrates the stage after the rescaling operation. As illustrated, FIG. 6 includes a waveform 600 and a corresponding circuit 605. The circuit 605 includes an original subset 620 that is connected to the interface node 650 through a two-input multiplexer 655. The multiplexer 655 receives data from sequential elements 610 and 611 that are driven by the 4× clock in the original subset 620.

The waveform 600 shows the timing relationship between the data provided to the interface node 650 and the 4× clock. During each period $T_{4\times}$ of the 4× clock, the interface node 650 samples two sets of data ('1' and '2') that are denoted by the notation (1, 2). Data set '1' is specified to be sampled at a timing delay $\Delta_1$ from the rising edge (sampling time A0) of the 4× clock while data set '2' is specified to be sampled at a timing delay $\Delta_2$ from the falling edge (sampling time B0) of the 4× clock. Correspondingly, the sequential element 610 in the original subset 620 is a flip-flop that provides data set '1' at 0° phase (rising edge) of the 4× clock, while the sequential element 611 is a flip-flop that provides data set '2' at 180° phase (falling edge).

The example rescaling operation has a rescaling factor of four and rescales the original subset 620, that operates using the fast 4× clock, into a rescaled netlist that operates using a slower 1× clock (at 1× frequency or at ¼ the frequency of the 4× clock). FIG. 7 illustrates a waveform 700 and a corresponding rescaled circuit 705 that has been rescaled by the 4× rescaling operation. The rescaled circuit 705 includes a rescaled subset 720 that is connected to the I/O or memory interface node 650 through an eight-input multiplexer 755. The multiplexer 755 receives data from eight sequential elements 710-717 that are driven by the 1× clock in the rescaled subset 720. In some embodiments, each of the sequential elements 710-717 is active only in its own particular phase of the 1× clock (i.e., sequential element 710 is only active at 0° and the sequential element 711 is only active at 45°, etc). In some of these embodiments, the multiplexer 755 is implemented as a single conductive wire to the interface node 650 since only one of the sequential elements is driving a signal to the interface node 650 at one time (i.e., different signals are driven on to the wire at non-overlapping statically scheduled time slots).

The waveform 700 shows the timing relationships between the data provided to the interface node 650 and the 1× clock. Since the rescaling operation is transparent to circuits outside the rescaled subset, the interface node 650 still receives two sets of data for each $T_{4x}$ period, which is equivalent to eight sets of data for each period $T_{1x}$ of the 1× clock. These eight data sets are denoted by four (1, 2) pairs in FIG. 7. Each of the eight data sets is provided by one of the eight sequential elements 710-717. Each sequential element is at one of the eight fractional phases of the 1× clock (i.e., 0°, 45°, 90°, 135°, 180°, 225°, 270°, and 315°), which correspond to eight different data transition times (A0, B0, A1, B1, A2, B2, A3, and B3). The eight different sampling times in the $T_{1x}$ period also correspond to the rising and falling edges of the 4× clock. Data sets marked as '1' are required to arrive at the interface node 650 at a timing delay $\Delta_1$ from the rising edge of the 4× clock (i.e., at a timing delay $\Delta_1$ from the data transition times A0, A1, A2, and A3). Data sets marked as '2' are required to arrive at the interface node 650 at a timing delay $\Delta_2$ from the falling edge of the 4× clock (i.e., at a timing delay $\Delta_1$ from the data transition times B0, B1, B2, and B3). As data transition times A0, B0, A1, B1, A2, B2, A3, and B3 correspond to the data transition times of the eight fractional phase sequential elements 510-517, the interface node 650 is able to receive the data sets marked as '1' and the data sets marked as '2' from the rescaled subset 720, which operates on the slower 1× clock.

Figure 8:
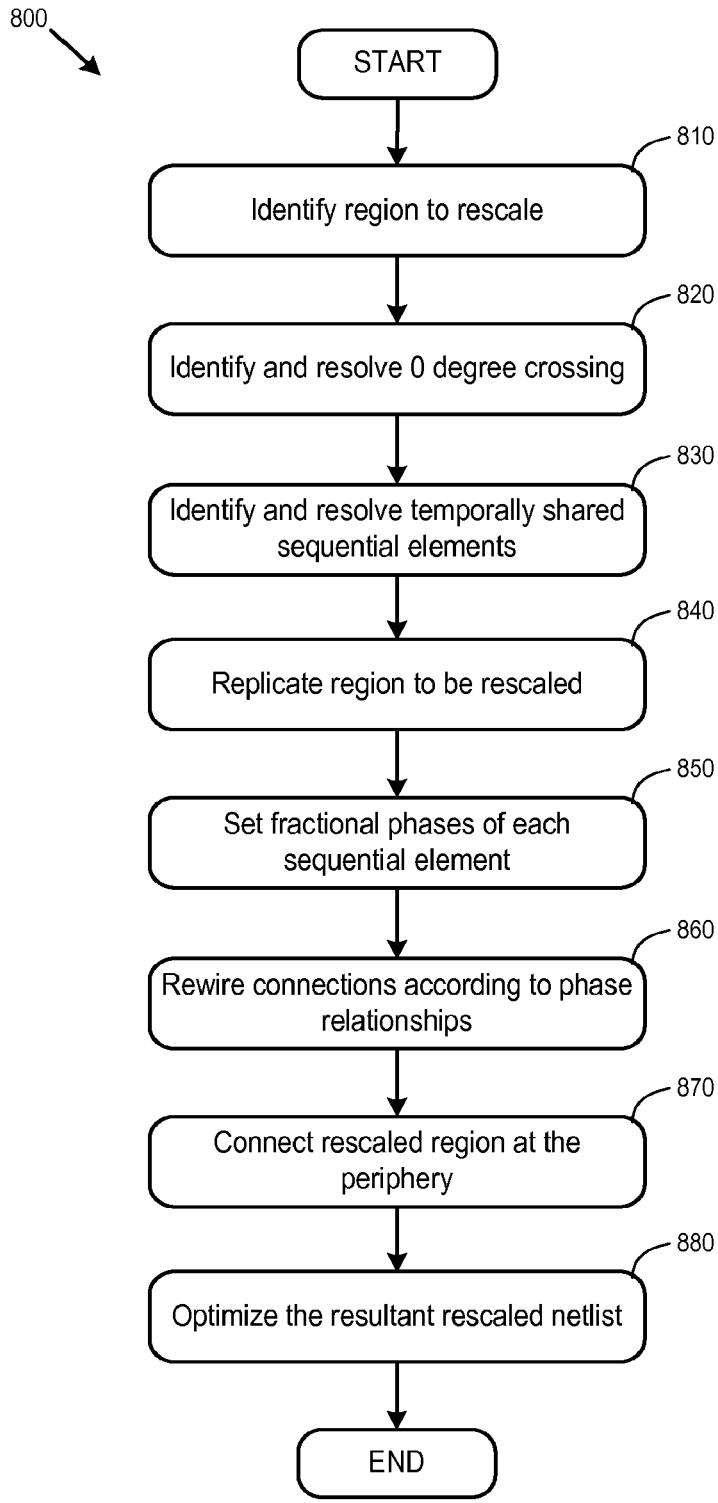
FIG. 8 conceptually illustrates a process for performing the rescaling operation.

For some embodiments, FIG. 8 conceptually illustrates a process 800 for performing the rescaling operation described above in FIGS. 1-7. In some embodiments, process 800 is used for ICs that include sub-cycle reconfigurable circuits. Examples of ICs that include sub-cycle reconfigurable circuits can be found in U.S. Pat. No. 7,295,037, which is incorporated herein by reference. However, this process can be implemented for other types of integrated circuits, such as other reconfigurable circuits, configurable circuits and application specific integrated circuits (ASIC), etc.

The process 800 starts (at 810) when a region or subset of a netlist is identified as a subset to be rescaled. In some embodiments, a region or a subset of the netlist designed to run at a higher clock rate (e.g., 2×) will be identified as the subset to be rescaled. In some embodiments, a physical design tool can designate any region of the netlist to be rescaled. In some embodiments, a rescaling factor is chosen so the subset of the netlist being rescaled will have the same clock frequency as the rest of the netlist. In some of these embodiments, the rescaling factor is chosen to be the same as the ratio between clock rates. In some other embodiments, a user may choose a rescale factor such that the rescaled subset does not run at the same clock frequency as the rest of the netlist.

Next, the process identifies (at 820) and resolves implicit 0° crossings. The process identifies connections from one sequential element through a logic element to another sequential element that implicitly crosses 0° phase. Some embodiments resolve such crossings, without changing functionality, by inserting explicit 0° sequential elements. This operation is illustrated in stage 220 of FIG. 2a.

Next, the process 800 identifies (at 830) and resolves temporally shared sequential elements. A netlist may have components that are temporally shared (i.e., used in multiple contexts). Some embodiments resolve this by replicating components so each component is used in a single context. When process 800 is not used for an IC that includes sub-cycle reconfigurable circuits, some embodiments do not perform the operation of identifying and resolving temporally shared sequential elements. This operation is performed in some embodiments to address issues specific to sub-cycle reconfigurable circuits.

The process 800 next replicates (at 840) the subset of the netlist to be rescaled. Some embodiments replicate the subset according to the rescaling factor determined at 810. In the examples illustrated in FIGS. 1 and 2a-b, the rescaling factor is 2, and the subset of the netlist to be rescaled is replicated twice (as illustrated in 120 and 230). In the example illustrated in FIGS. 3a-b, the rescaling factor is 4, and the subset of the netlist to be rescaled is replicated four times (as illustrated in 320).

Next, the process 800 sets (at 850) fractional phases of each sequential element in the replicated subset of the netlist. In some embodiments, each copy or replica of the subset of the netlist being rescaled is based on a different fractional phase of a fractional clock, and a different fractional phase is assigned to each copy based on the copy's index. Within each copy, each sequential element is assigned an offset phase from the fractional phase of the copy based on the phase of the sequential element's counterpart in the original netlist. In some embodiments, this determination is based on equation (1). Examples of the calculation of fractional phases for sequential elements are illustrated above in FIG. 1 at stage 120, FIG. 2a at stage 230, and FIG. 3a at stage 320.

Next, the process 800 rewires (at 860) connections according to the correct phase relationships. In some embodiments, this process includes a step for identifying input connections to sequential elements that are not in the correct phase relationship with the sequential element and another step for rewiring those connections to a logically equivalent input that is at the correct phase relationship with the sequential element. Examples of identifying input connections are illustrated above in FIG. 1 at stage 130, FIG. 2b at stage 240, and FIG. 3a at stage 330. Examples of rewiring connections to a logically equivalent input are illustrated in FIG. 1 at 140, FIG. 2b at stage 250, and FIG. 3a at stage 340.

Next, the process 800 connects (at 870) the rescaled region or subset to the rest of the netlist by connecting the rescaled subset to the periphery components. In some of these embodiments, each input of the rescaled subset is connected to an input periphery component with the nearest earlier phase of capture, and each output periphery component connects to the rescaled subset at an output node that is at the nearest earlier phase of capture. The periphery component can be a flip-flop that samples or provides data at precise clock edges, such as illustrated in FIGS. 1-3. The periphery component can also be an interface node of a memory interface or an I/O boundary that specifies a timing delay, such as described above by reference to FIGS. 4-7.

Lastly, the process 800 optimizes (at 880) the resultant rescaled netlist by removing or trimming nodes (sequential and combinational elements) that do not lead to at least one output. Examples of such optimization can be found in FIG. 1 at stage 170, FIG. 2b at stage 260, and FIG. 3b at stage 370. In some embodiments, the process 800 further optimizes the rescaled netlist by removing non-zero degree sequential elements and replacing them with logical wires. Examples of such optimization can be found in FIG. 2c at stage 270, and in FIG. 3b at stage 380. After optimizing the resultant rescaled netlist, the process 800 ends.

II. Configurable IC Architecture

An IC is a device that includes numerous electronic components (e.g., transistors, resistors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit that has configurable circuits. A configurable circuit is a circuit that can "configurably" perform a set of operations. Specifically, a configurable circuit receives a configuration data set that specifies the operation that the configurable circuit must perform from the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of ways. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in any or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 9:
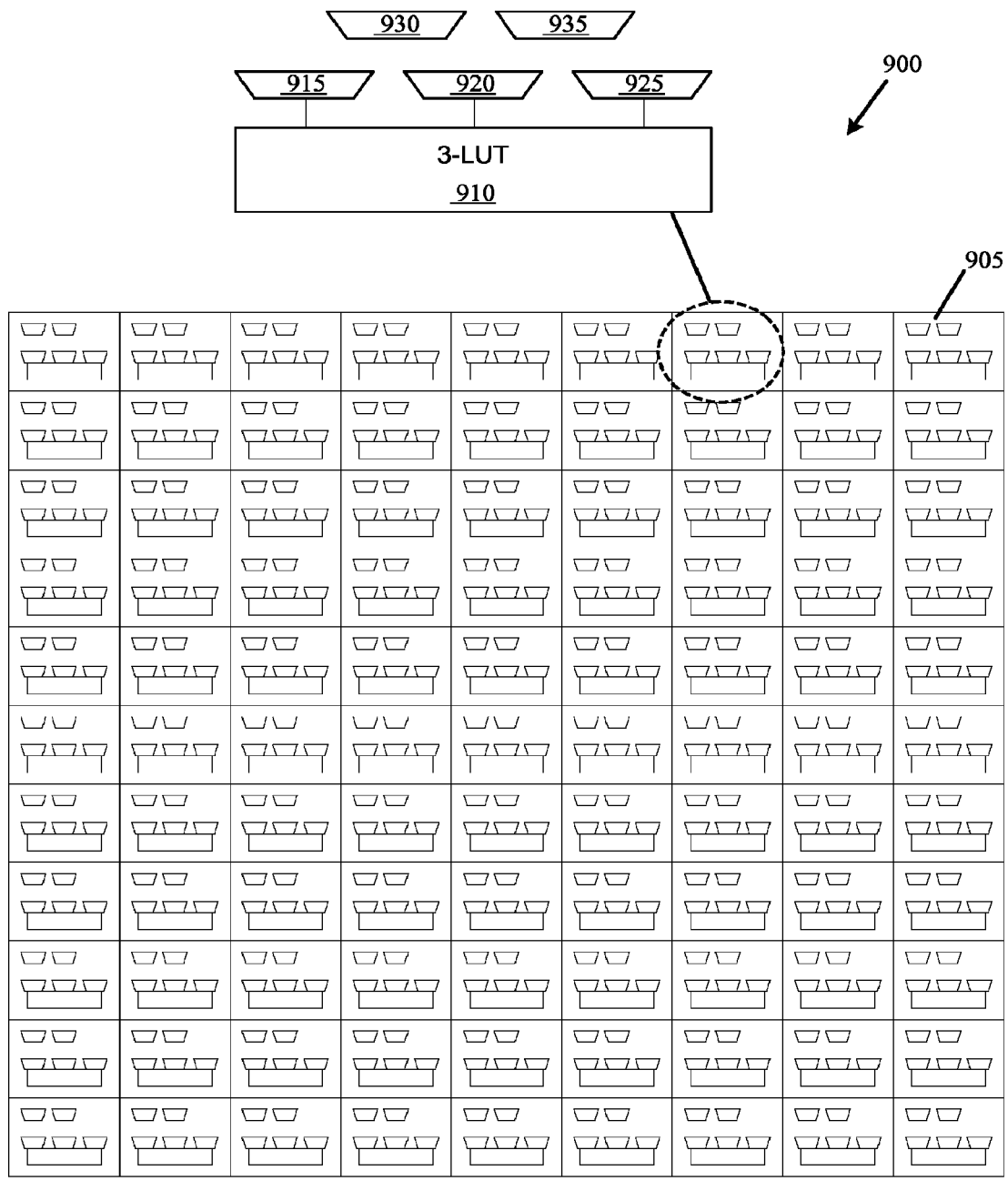
FIG. 9 illustrates a configurable circuit architecture that is formed by numerous configurable tiles that are arranged in an array with multiple rows and columns of some embodiments.
Figure 10:
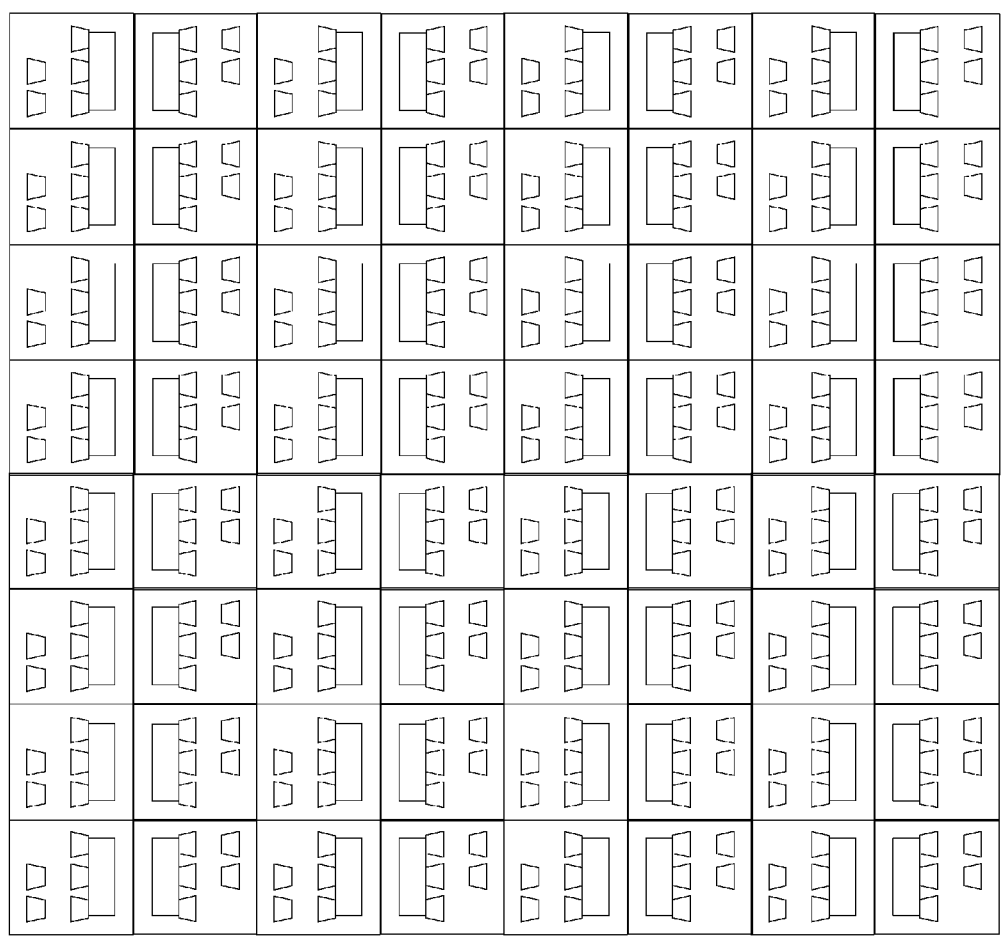
FIG. 10 provides one possible physical architecture of the configurable IC illustrated in FIG. 9 of some embodiments.
Figure 11:
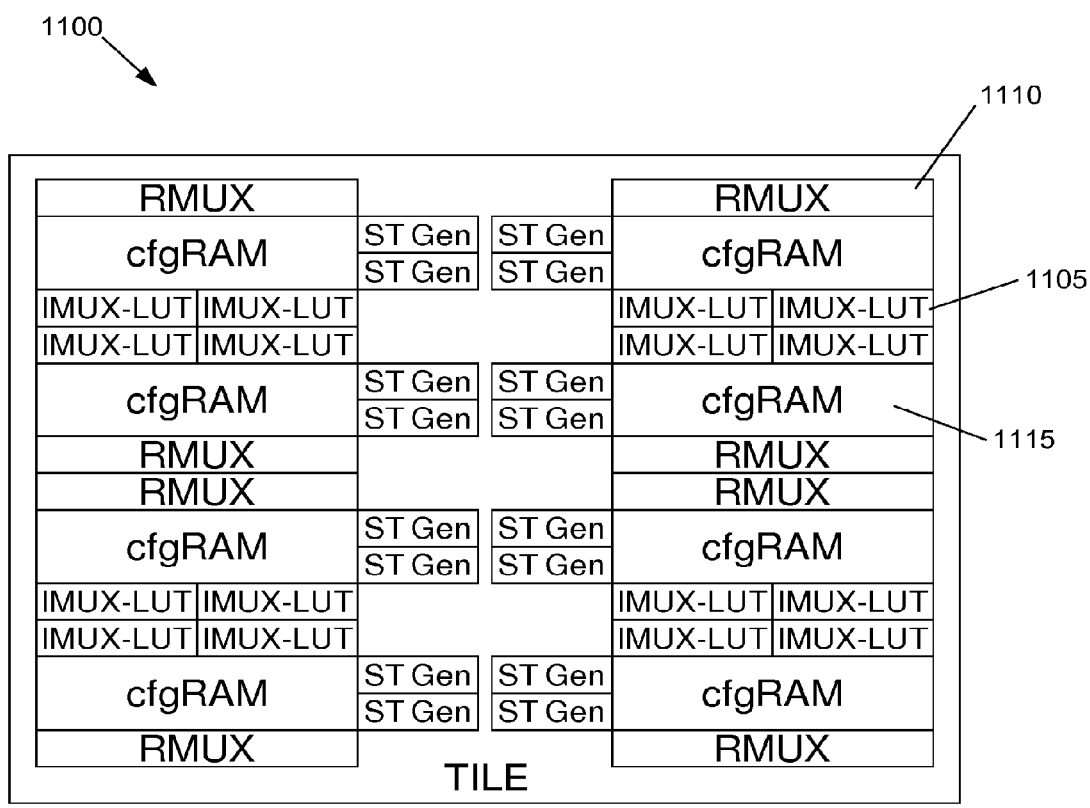
FIG. 11 illustrates a detailed tile arrangement of some embodiments.

In some embodiments, the configurable circuits might be organized in an arrangement that has all the circuits organized in an array with several aligned rows and columns In addition, within such a circuit array, some embodiments disperse other circuits (e.g., memory blocks, processors, macro blocks, IP blocks, SERDES controllers, clock management units, etc.). FIGS. 9-11 illustrate several configurable circuit arrangements/architectures that include the invention's circuits. One such architecture is illustrated in FIG. 9.

The architecture of FIG. 9 is formed by numerous configurable tiles 905 that are arranged in an array with multiple rows and columns. In FIG. 9, each configurable tile includes a configurable three-input LUT 910, three configurable input-select multiplexers 915, 920, and 925, and two configurable routing multiplexers 930 and 935. Different embodiments have different numbers of configurable interconnect circuits 915-935. For instance, some embodiments may have eight configurable interconnect circuits while others may have more or less such circuits. For each configurable circuit, the configurable IC 900 includes a set of storage elements (e.g., a set of SRAM cells) for storing a set of configuration data bits. Storage elements may alternatively be referred to as storage circuits.

In some embodiments, the logic circuits are look-up tables while the interconnect circuits are multiplexers. Also, in some embodiments, the LUTs and the multiplexers are sub-cycle reconfigurable circuits (sub-cycles of reconfigurable circuits may be alternatively referred to as "reconfiguration cycles"). In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 9, an input-select multiplexer (also referred to as an "IMUX") 915 is an interconnect circuit associated with the LUT 910 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as "HMUXs") capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 9, a routing multiplexer (also referred to as an RMUX) 930 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 9 form the routing fabric along with the wire-segments that connect to the RMUXs, and the vias that connect to these wire segments and/or to the RMUXs. In some embodiments, the routing fabric further includes buffers for achieving one or more objectives (e.g., to maintain the signal strength, reduce noise, alter signal delay, etc.) with respect to the signals passing along the wire segments.

Various wiring architectures can be used to connect the RMUXs, IMUXs, and LUTs. Several examples of the wire connection scheme are described in U.S. Pat. No. 7,295,037, entitled "Configurable IC with Routing Circuits with Offset Connections", issued on Nov. 13, 2007.

Several embodiments are described below by reference to a "direct connection." In some embodiments, a direct connection is established through a combination of one or more wire segments, and potentially one or more vias, but no intervening circuit. In some embodiments, a direct connection might, however, include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direct connection. Also, some connections are referred to below as configurable connections and some circuits are described as configurably connected. Such references signify that the circuits are connected through a configurable interconnect circuit (such as a configurable routing circuit).

In some embodiments, the examples illustrated in FIG. 9 represent the actual physical architecture of a configurable IC. However, in other embodiments, the examples illustrated in FIG. 9 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the physical architecture of the IC appears quite different than its topological architecture. FIG. 10 provides one such possible physical architecture of the configurable IC 900 illustrated in FIG. 9.

Having the aligned tile layout with the same circuit elements of FIG. 10 simplifies the process for designing and fabricating the IC, as it allows the same circuit designs and mask patterns to be repetitively used to design and fabricate the IC. In some embodiments, the similar aligned tile layout not only has the same circuit elements but also has the exact same internal wiring between their circuit elements. Having such a layout further simplifies the design and fabrication processes by further simplifying the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 11 illustrates an alternative tile structure that is used in some embodiments. This tile 1100 has four sets 1105 of 4-aligned LUTs along with their associated IMUXs. It also includes eight sets 1110 of RMUXs and eight banks 1115 of configuration RAM storage. Each 4-aligned LUT tile shares one carry chain. One example of which is described in U.S. Pat. No. 7,295,037, entitled "Configurable IC with Routing Circuits with Offset Connections", issued on Nov. 13, 2007. One of ordinary skill in the art would appreciate that other organizations of LUT tiles may also be used in conjunction with the invention and that these organizations might have fewer or additional tiles.

III. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 12:
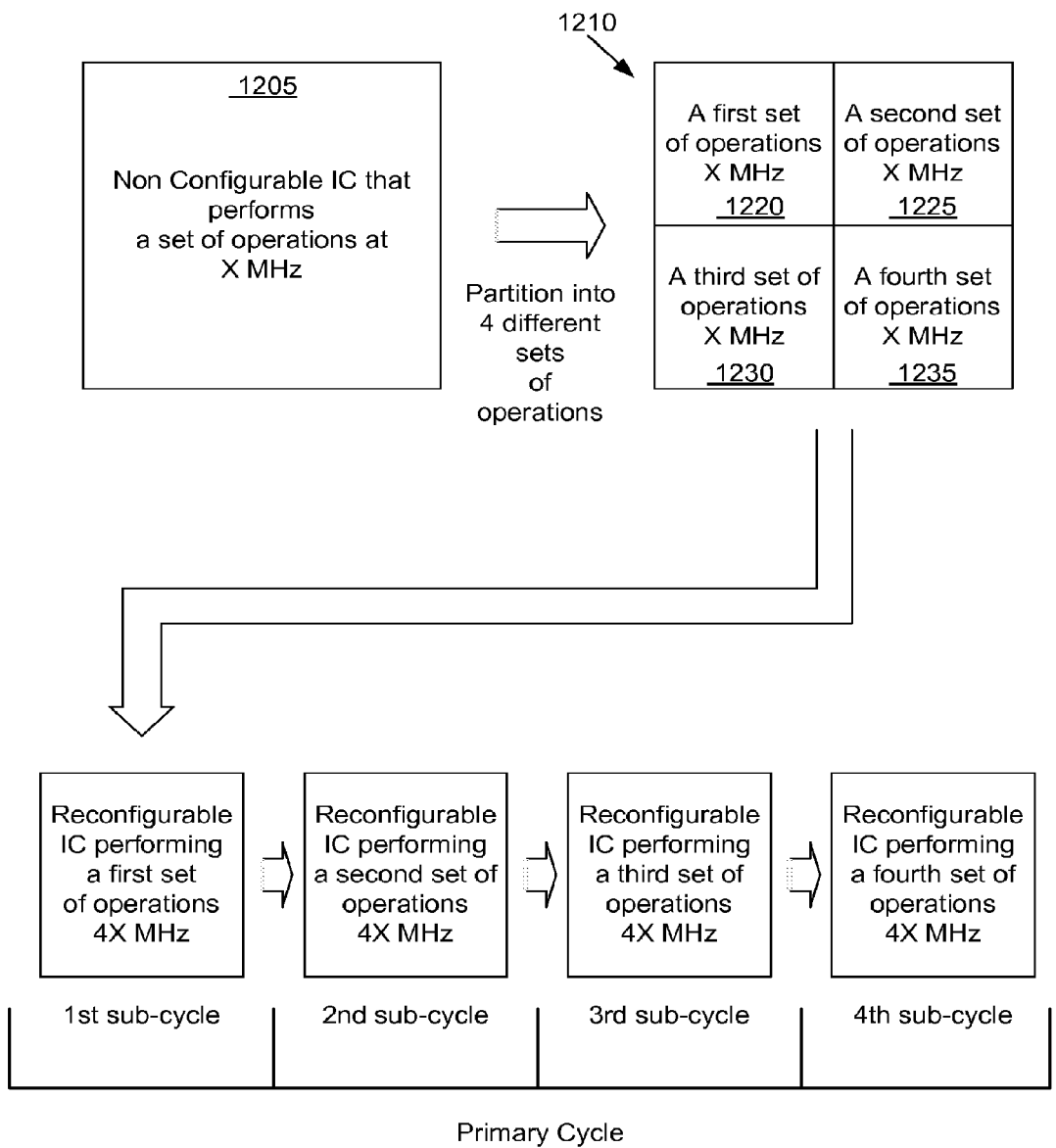
FIG. 12 illustrates an example of a sub-cycle reconfigurable IC of some embodiments.

FIG. 12 conceptually illustrates an example of a sub-cycle reconfigurable IC (i.e., an IC that is reconfigurable on a sub-cycle basis). In this example, the sub-cycle reconfigurable IC implements an IC design 1205 that operates at a clock speed of X MHz. The operations performed by the components in the IC design 1205 can be partitioned into four sets of operations 1220-1235, with each set of operations being performed at a clock speed of X MHz.

FIG. 12 then illustrates that these four sets of operations 1220-1235 can be performed by one sub-cycle reconfigurable IC 1210 that operates at 4×MHz. In some embodiments, four cycles of the 4×MHz clock correspond to four sub-cycles within a cycle of the X MHz clock. Accordingly, this figure illustrates the reconfigurable IC 1210 reconfiguring four times during four cycles of the 4×MHz clock (i.e., during four sub-cycles of the X MHz clock). During each of these reconfigurations (i.e., during each sub-cycle), the reconfigurable IC 1210 performs one of the identified four sets of operations 1220-1235. In other words, the faster operational speed of the reconfigurable IC 1210 allows this IC to reconfigure four times during each cycle of the X MHz clock, in order to perform the four sets of operations 1220-1235 sequentially at a 4×MHz rate instead of performing the four sets of operations in parallel at an X MHz rate.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes (e.g., 8, 16, 32, etc.,) can likewise be implemented.

For some embodiments, real-time reconfigurable circuits as described above by reference to FIGS. 9-12 are used to implement user designs that have been rescaled according to the techniques discussed above by reference to FIGS. 1-8. In some of these embodiments, the different phases of the clock that drive a rescaled logic region of the IC can be mapped to the different reconfiguration sub-cycles of a user design clock.

Figure 13:
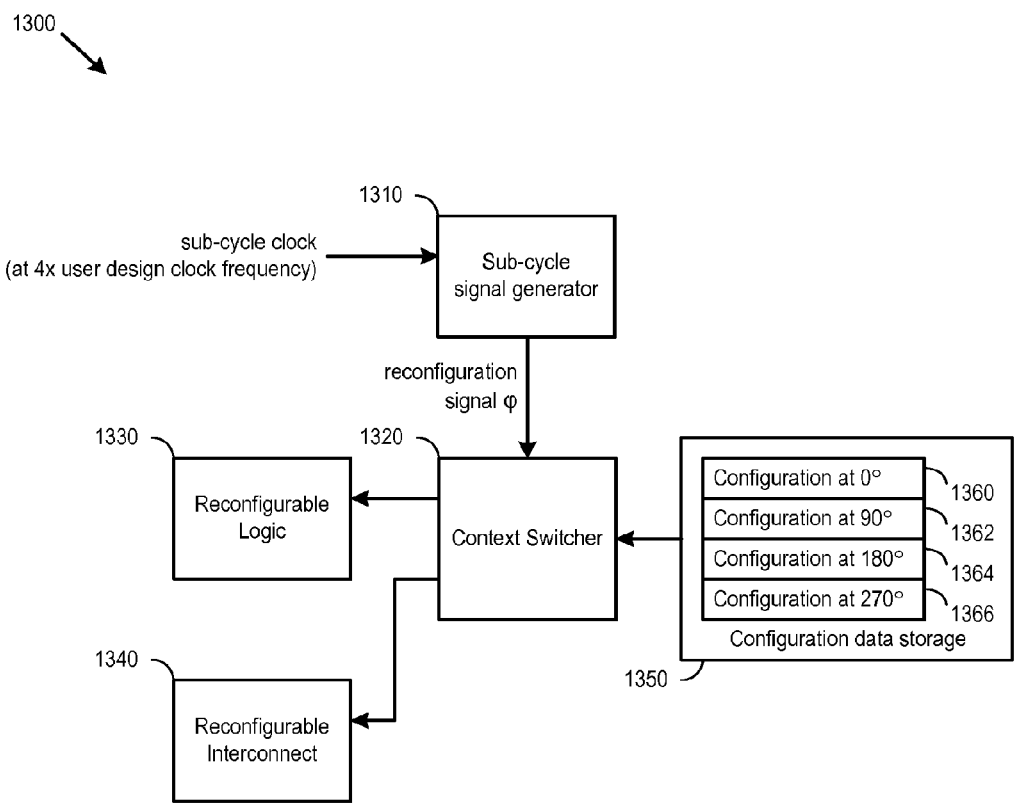
FIG. 13 illustrates an example of a reconfigurable circuit that is used to implement a rescaled user design.

FIG. 13 illustrates an example of a reconfigurable circuit 1300 that is used to implement a rescaled user design. As illustrated, the reconfigurable circuit 1300 includes a local sub-cycle signal generator 1310, a context switcher 1320, a reconfigurable logic circuit 1330, a reconfigurable interconnect circuit 1340 and a configuration data storage 1350.

The sub-cycle signal generator 1310 generates a reconfiguration signal p to the context switcher 1320, which uses the reconfiguration signal to load different configuration data set from configuration data storage 1350 to reconfigure the reconfigurable logic circuit 1330 and reconfigurable interconnect circuit 1340 on every sub-cycle. In some embodiments, the sub-cycle signal generator 1310 includes a counter that increments once every sub-clock cycle.

The configuration data storage 1350 includes four entries for the four different reconfiguration cycles in this example of a 4-loopered scheme. For some embodiments that use reconfigurable circuits to implement rescaling, a rescaled set of the circuits having four different phases (0°, 90°, 180°, and 270°) can be mapped to the four configuration data entries of the configuration data storage 1350. The entry 1360 of the configuration data storage 1350 stores the configuration of the circuit when the sub-cycle clock is at the first sub-cycle, which contains the configuration of the rescaled subset of the IC when the clock is at 0° phase. Likewise, the entry 1362 corresponds to the second reconfiguration sub-cycle and contains the configuration of the rescaled region when the clock is at 90°. The entry 1364 corresponds to the third reconfiguration sub-cycle and contains the configuration of the rescaled region when the clock is at 180°. Finally in this example, the entry 1366 corresponds to the fourth reconfiguration sub-cycle and contains the configuration of the rescaled region when the clock is at 270'.

FIGS. 14*a*-14*d* illustrate an example of the contents of the configuration data storage entries by referencing the rescaling example of FIGS. 2*a*-2*b*. FIGS. 14*a*-14*d* illustrate the relevant elements of the rescaled circuit 260 that will be mapped into configuration data for the reconfigurable circuit 1300 of FIG. 13. Some embodiments map the sequential elements to available storage elements in the reconfigurable logic circuits 1330 or the reconfigurable interconnect circuit 1340. Some embodiments map the combinational nodes to logic resources in the reconfigurable logic circuits 1330 and the connections between combinational nodes to routing resources in the reconfigurable interconnect circuits 1340.

Figure 14A:
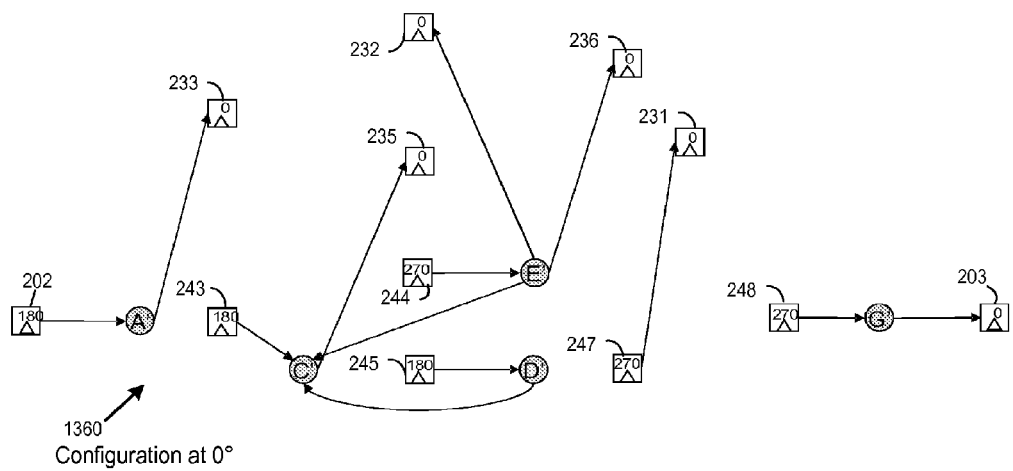
FIGS. 14a-14d illustrate an example of the contents of the configuration data storage entries.

FIG. 14*a* graphically illustrates the portions of the rescaled circuit 265 that are stored in the entry 1360 as the configuration data for the first reconfiguration sub-cycle (0° phase). For some embodiments, configuration data for 0° phase includes all sequential elements operating at 0° phase (203, 231, 232, 233, 235, and 236) and all combinational elements feeding these sequential elements (A', C', D', B', and G'). In some embodiments, the entry 1360 also includes the sequential elements that serve as data sources during the 0° phase (e.g., sequential elements 202, 243, 244, 245, 247, and 248).

Figure 14B:
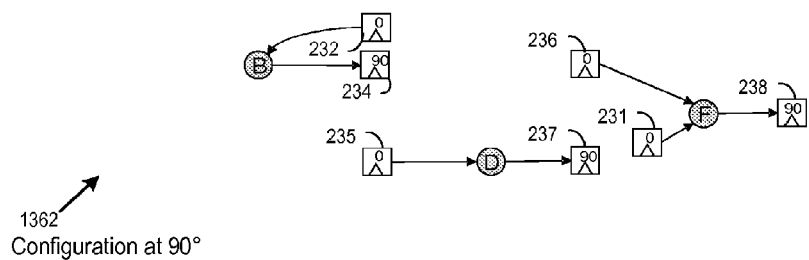

FIG. 14*b* graphically illustrates the portions of the rescaled circuit 265 that are stored in the entry 1362 as the configuration data for the second reconfiguration sub-cycle (90° phase). For some embodiments, configuration data for 90° phase includes all sequential elements operating at 90° phase (234, 237, and 238) and all combinational elements feeding these sequential elements (B, D, and F). In some embodiments, the entry 1362 also includes the sequential elements that serve as signal sources during the 90° phase (e.g., sequential elements 231, 232, 235, and 236).

Figure 14C:
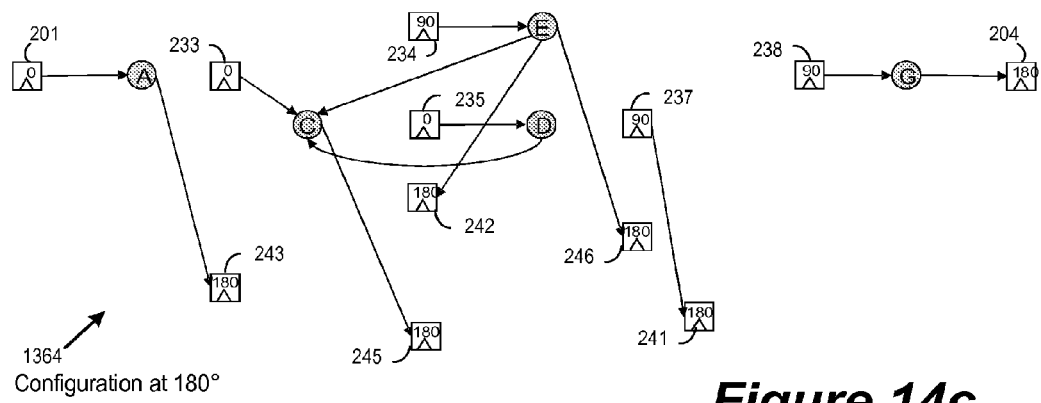

FIG. 14*c* graphically illustrates the portions of the rescaled circuit 265 that are stored in the entry 1364 as the configuration data for the third reconfiguration sub-cycle (180° phase). For some embodiments, configuration data for 180° phase includes all sequential elements operating at 180° phase (204, 241, 242, 243, 245, and 246) and all combinational elements feeding these sequential elements (A, C, D, E, and G). In some embodiments, the entry 1364 also includes the sequential elements that serve as signal sources during the 180° phase (e.g., sequential elements 201, 233, 234, 235, 237, and 238).

Figure 14D:
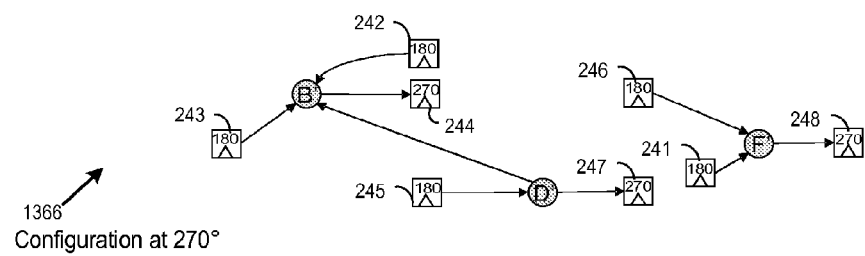

FIG. 14*d* graphically illustrates the portions of the rescaled circuit 265 that are stored in the entry 1366 as the configuration data for the fourth reconfiguration sub-cycle (270° phase). For some embodiments, configuration data for 270° phase includes all sequential elements operating at 270° phase (244, 247, and 248) and all combinational elements feeding these sequential elements (B', D', and F'). In some embodiments, the entry 1366 also includes the sequential elements that serve as signal sources during the 270° phase (e.g., sequential elements 241, 242, 243, 245, and 246).

In some embodiments, the rescaled circuit 265 goes through a retiming or re-scheduling transformation before being mapped to the reconfiguration sub-cycles. A retiming or rescheduling transformation in some embodiments is performed by moving components in the rescaled netlist from one phase to another (and hence between different reconfiguration sub-cycles) while maintaining logical relationships between components of the rescaled circuit. In some of these embodiments, the retiming or rescheduling transformation is performed in order to find an optimal mapping between the rescaled circuit and the reconfiguration sub-cycles (e.g., to optimize timing paths or to optimize configuration storage).

The example illustrated in FIGS. 14*a*-*d* is based on the rescaled circuit 265 of stage 260 of FIGS. 2*a*-*c*. One of ordinary skill would realize that the operation to map elements from a rescaled circuit to configuration data for a reconfigurable circuit 1300 could be performed on the optimized circuit 275 of stage 270 as well. For example, combinational elements in paths between the remaining zero degree sequential elements of the optimized circuit 275 could be divided into different reconfiguration sub-cycles of the reconfigurable circuit 1300. Some embodiments could divide the combinational elements based on constraints on timing delays.

While the reconfigurable circuits described above reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, and then repeat the sequence of configurations multiple times.

IV. Performance Enhancement using Rescaling

A. Data Throughput

For some embodiments, rescaling a particular set of circuits in an IC allows increased data throughput without using clocks of higher frequencies. As mentioned above, rescaling in some embodiments is an operation that transforms a subset of a netlist that operates in an original frequency into its logical equivalent that operate on a fractional frequency using fractional clock phases. Instead of operating the transformed (or rescaled) subset of the netlist on a clock with the fractional frequency, some embodiments continue to operate the rescaled circuit on the original frequency. Operating the rescaled circuit on the original clock effectively multiplies the throughput of the rescaled circuit by the rescaling factor and decreases the latency by the rescaling factor.

Figure 15A:
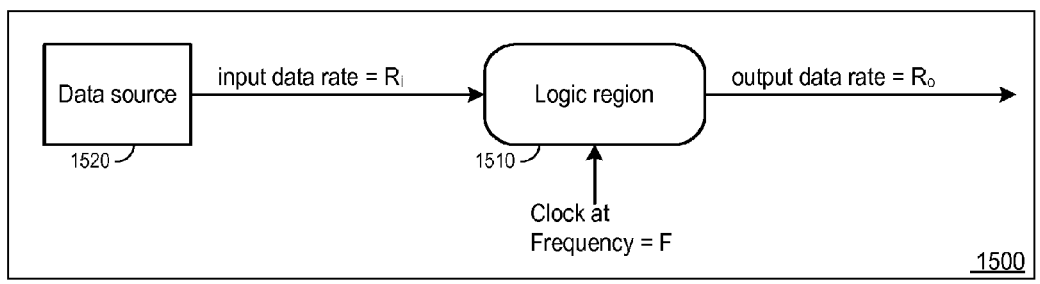
FIGS. 15a-b illustrate a relationship between the throughput of a logic region and the frequency of the clock that is used to operate the logic region.
Figure 15B:
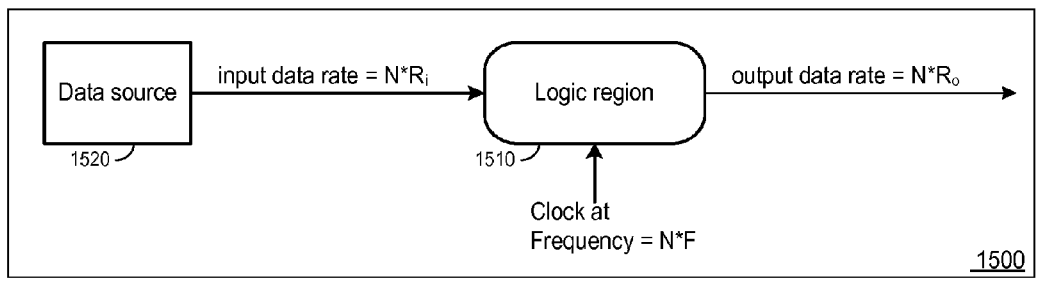

FIGS. 15a-b illustrate the relationship between the throughput (or data rate) of a logic region and the frequency of the clock that is used to operate the logic region. As illustrated, an IC 1500 includes a logic region 1510 that receives data from a data source 1520. The logic region 1510 can be an arithmetic processing unit, a control unit, or any other type of data processing module. The data source 1520 can be an interface module for an external data source, a CPU, an ALU, another data processing module, or any other type of circuit that produces data to be processed by logic region 1510.

As illustrated in FIG. 15a, the logic region 1510 of the IC 1500 is operating on clock with frequency F, which allows the logic region 1510 to process data at input data rate $R_i$ and produce processed data at output data rate $R_o$. By increasing the frequency of the clock driving the logic region 1510 N times to N*F as illustrated in FIG. 15b, the input data rate can be increased to $N*R_i$ and the output data rate can be increased to $N*R_o$.

Figure 16:
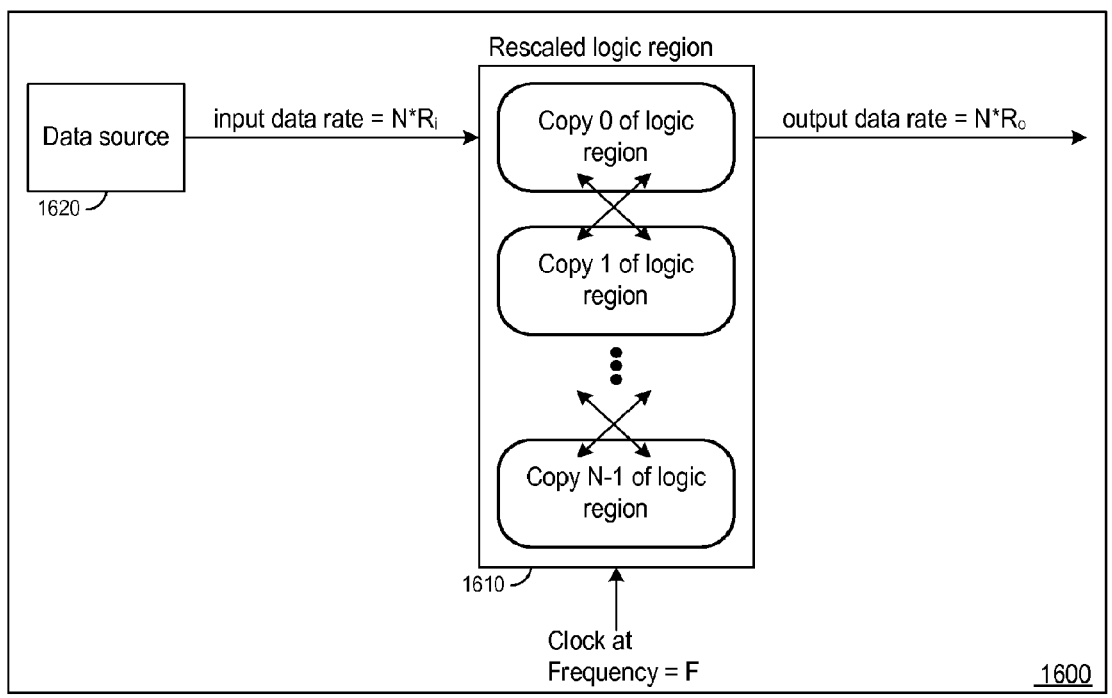
FIG. 16 illustrates an example IC with a logic region that has been rescaled to result in increased throughput without increasing clock rate.

Rescaling allows increased throughput without increasing clock rate. FIG. 16 illustrates an example IC 1600 with a logic region that has been rescaled for increasing throughput without increasing clock rate. The rescaled logic region 1610 is a version of the logic region 1510 resealed by a factor of N. The rescaled logic region 1610 operates on the same clock frequency F as the logic region 1510 in FIGS. 15a-b. With the logic region rescaled by a factor of N operating on clock frequency F, the IC 1600 can support an input data rate of $N*R_i$ and an output data rate $N*R_o$.

Figure 17:
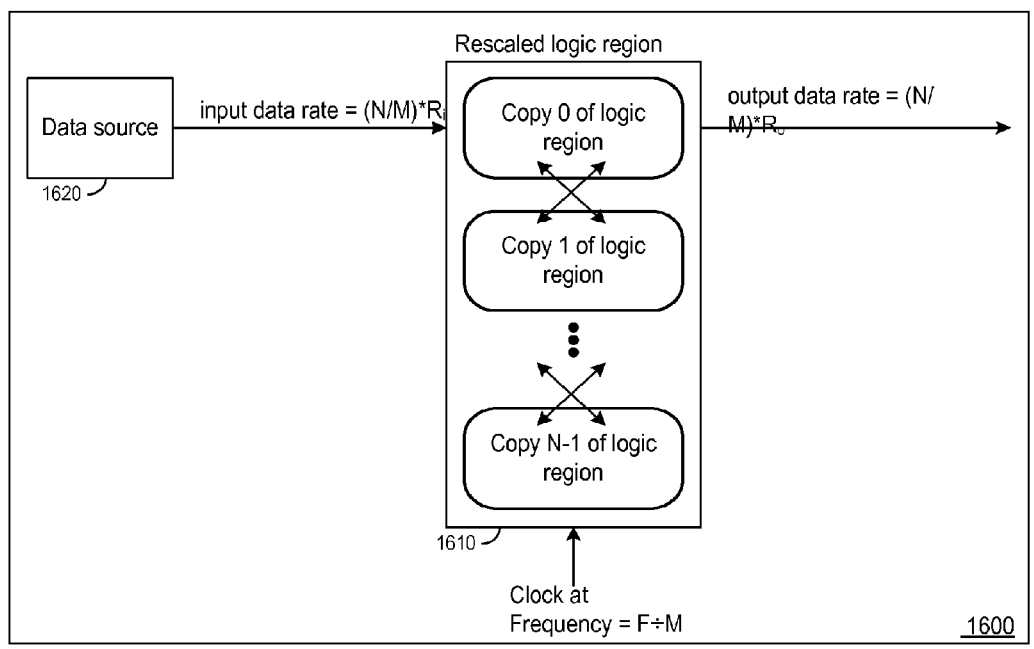
FIG. 17 illustrates an example IC that uses rescaling to reduce clock frequency while maintaining throughput.

Instead of using rescaling to increase throughput in an IC, some embodiments maintain the same throughput, but perform rescaling to lower the required clock frequency. FIG. 17 illustrates the example IC 1600 that uses rescaling to reduce clock frequency while maintaining throughput. As illustrated, the rescaled logic region 1610 receives a clock at a fractional frequency F/M. However, with the rescaled logic region having a rescaling ratio N, the input data rate is still at $N/M*R_i$ while the output data rate is still at $N/M*R_o$. One of ordinary skill would recognize that M can be any integer such that when M=N, the IC 1600 would have the same throughput as the IC 1500 in FIG. 15a, even though the rescaled logic region is operating at only a fraction of the frequency.

In some embodiments, rescaling transforms an original set of circuits that operate at one frequency to a rescaled set of circuits that operate at another frequency. By applying rescaling factors appropriately, the number of clock domains required to implement an IC design can be minimized. This is beneficial in some embodiments for the realization of circuits in the IC.

B. Maintaining High Logic Density

For some embodiments that include reconfigurable circuits, a higher order loopered scheme is sometimes said to result in a higher logic density than a lower order loopered scheme. For example, a reconfigurable circuit under an 8-loopered scheme is reconfigured to cyclically perform 8 different functionalities in 8 different clock cycles according to 8 different configurations, while the same reconfigurable circuit under a 4-loopered scheme is reconfigured to cyclically perform only 4 different functionalities. The 8-loopered scheme thus achieves higher logic density than the 4-loopered scheme because a same set of configurable circuits performs more functions under the 8-loopered scheme than the 4-loopered scheme.

For some embodiments, higher order loopered schemes (i.e., higher logic density) are often desirable because they allow more placement and routing freedom. The orders of loopered schemes are, however, limited by the maximum frequency of the sub-cycle clock. For example, an IC that supports a maximum clock frequency of 1600 MHz cannot implement a loopered scheme that requires a sub-cycle clock frequency of 3200 MHz. Accordingly, an 8-loopered, 400 MHz data rate design cannot be implemented by simply running the reconfigurable circuit at 8 times the user clock rate (8×400 MHz=3200 MHz). Instead, a 4-loopered, 400 MHz data rate design (4×400 MHz=1600 MHz) can be implemented in such an IC; however, such an IC would have lower logic density than an IC that implements an 8-loopered, 400 MHz data rate design.

Figure 18:
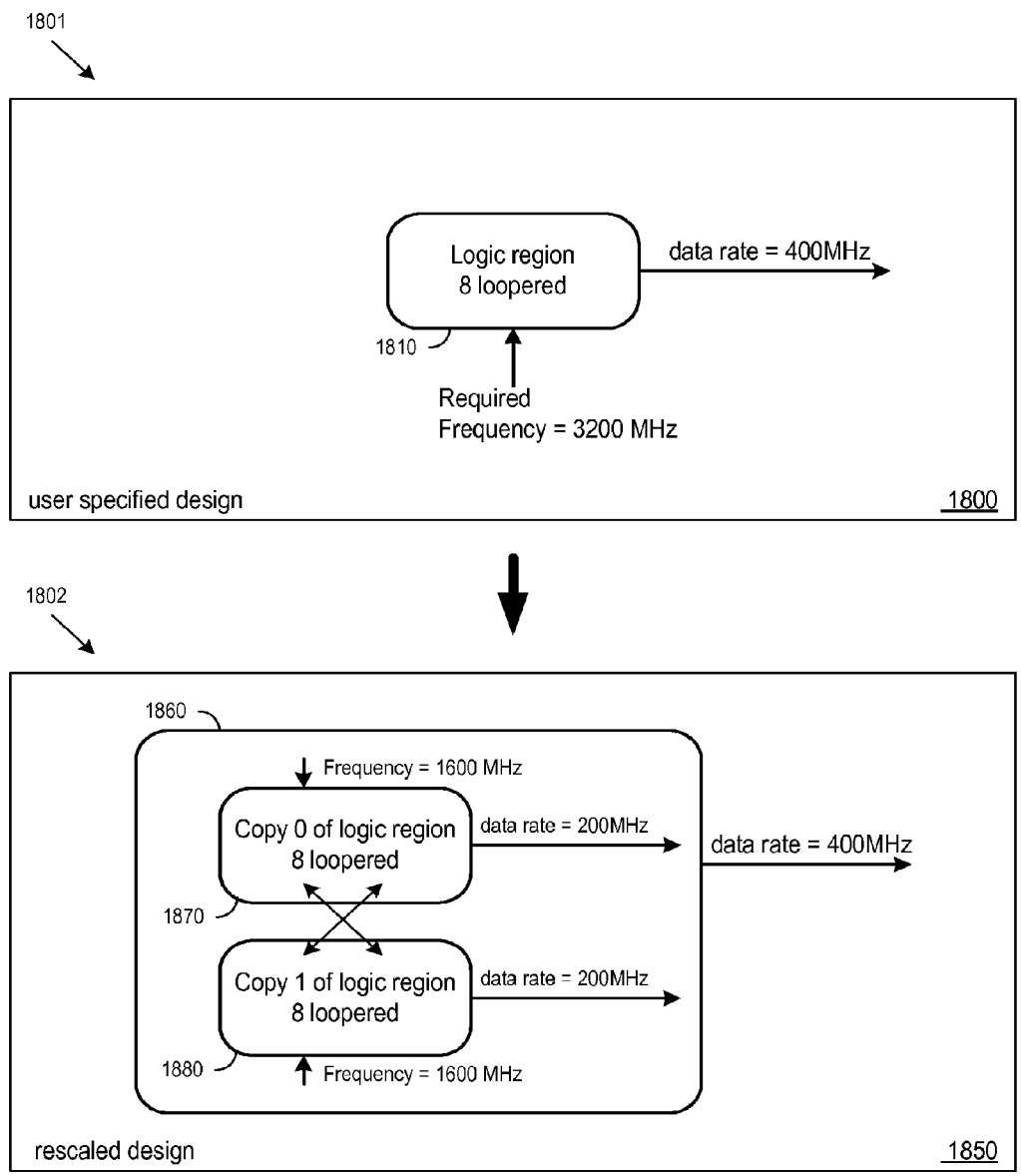
FIG. 18 illustrates an example of using rescaling to implement an 8-loopered, 400 MHz design by using a 1600 MHz sub-cycle clock.

By replicating an original set of circuits into replica sets of circuits, rescaling creates a rescaled set of circuits that can operate in fractional frequencies while maintaining logic density (i.e., the order of looperness). For example, the 8-loopered, 400 MHz data rate design discussed above can be implemented using only a 1600 MHz sub-cycle clock rate by rescaling by a factor of 2. FIG. 18 illustrates an example of using rescaling to implement an 8-loopered, 400 MHz design by using a 1600 MHz sub-cycle clock for some embodiments.

The rescaling operation in FIG. 18 is illustrated in two stages 1801 and 1802. Stage 1801 illustrates a user-specified design 1800 and stage 1802 illustrates a rescaled design 1850 that is the result of rescaling the user-specified design 1800.

At stage 1801, the user has specified an implementation of a logic region 1810 that has a user data rate of 400 MHz by using an 8-loopered scheme. Without rescaling, the design requires a 400 MHz×8=3200 MHz sub-cycle clock to operate the logic region 1810.

At stage 1802, the specified design has been transformed (rescaled) into the rescaled design 1850 by a rescaling factor of 2. The logic region 1810 of the original set of circuits has been rescaled into a rescaled set of circuits 1860 that includes replica circuits 1870 and 1880, where each of the replica circuits operates an 8-loopered scheme and supports a data rate of 200 MHz by using a 1600 MHz sub-cycle clock (8×200 MHz=1600 MHz). The rescaled set of circuits 1860 is able to support an overall data rate of 400 MHz (200 MHz+ 200 MHz) while maintaining logic density afforded by the 8-loopered scheme.

One of ordinary skill would recognize that many other techniques commonly known in the art could be used to constitute a data stream at a 400 MHz data rate out of the two 200 MHz outputs from the two replica circuits 1870 and 1880. For example, some embodiments produce one 400 MHz data stream by time-multiplexing the two 200 MHz outputs of the two replica circuits 1870 and 1880. As another example, some embodiments present the two 200 MHz outputs of the two replica circuits 1870 and 1880 together in a parallel fashion as a wider data word.

Figure 19:
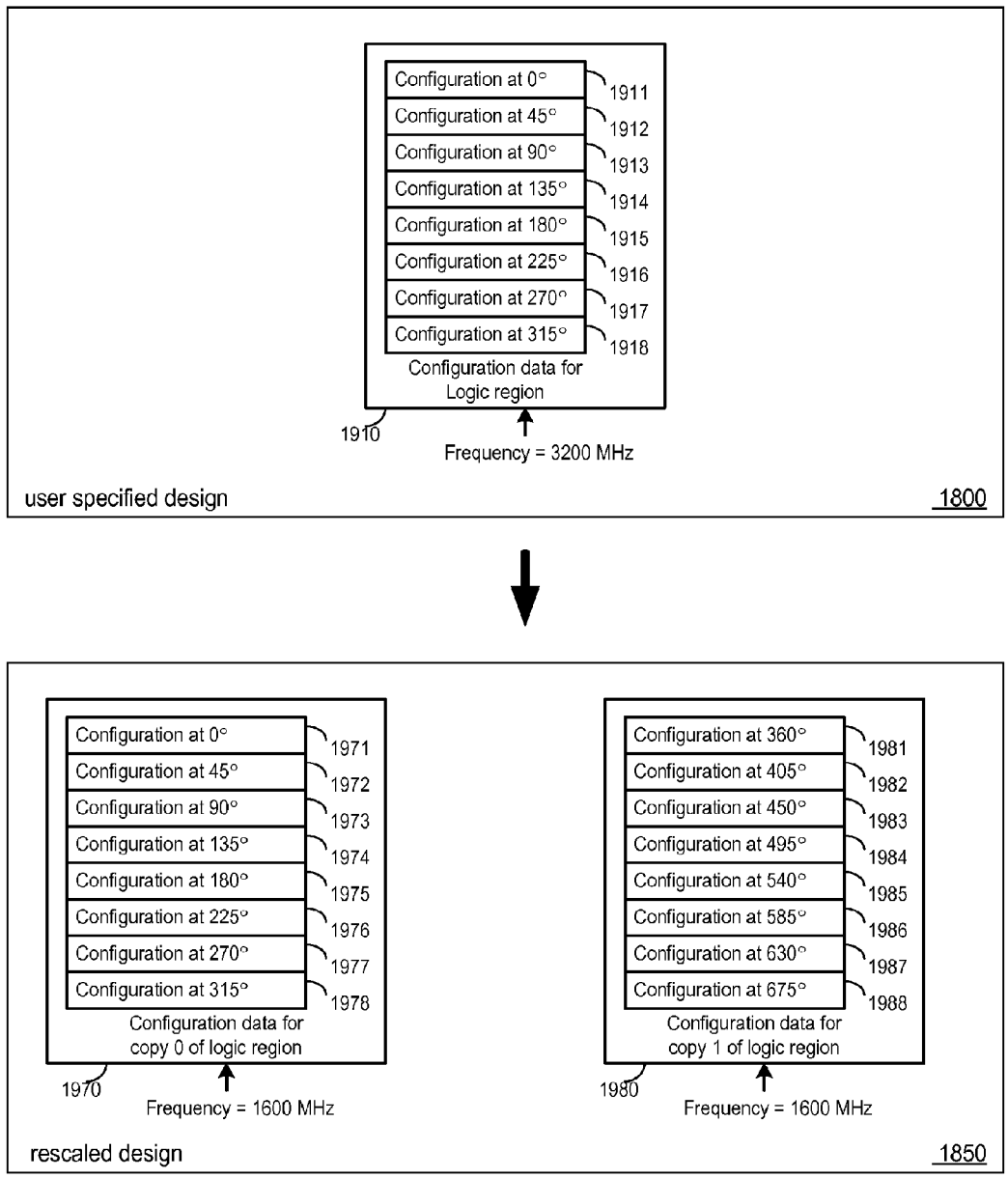
FIG. 19 illustrates an example configuration data set transformed by the rescaling operation of FIG. 18.

FIG. 19 illustrates example configuration data sets for the user specified design 1800 and the rescaled design 1850 of FIG. 18 for some embodiments. As illustrated, an original configuration data set 1910 is for cyclically reconfiguring the logic region 1810 into performing certain operations at the user specified data rate of 400 MHz. As discussed above by reference to FIGS. 13-14, some embodiments map the configuration data at each sub-cycle of reconfiguration to a fractional phase. In this 8-loopered scheme, configuration data 1911-1918 maps into eight fractional phases that are ⅛ of 360° apart (e.g., 0°, 45°, 90°, 135°, 180°, 225°, 270°, and 315°; these angles are with respect to the 400 MHz clock used by the original design).

The rescaling operation that transforms the user specified design 1800 to the rescaled design 1850 also transforms the original configuration data set 1910 into configuration data sets 1970 and 1980. Configuration data set 1970 is for cyclically reconfiguring the first replica set of circuits 1870 (copy 0 of logic region) in the rescaled set of circuits 1860. Configuration data set 1980 is for cyclically reconfiguring the second replica set of circuits 1880 (copy 1 of logic region) in the rescaled set of circuits 1860. According to equation (1), the fractional phases for copy 0 of the logic region 1870 is thus 0°, 22.5°, 45°, 67.5°, 90°, 112.5°, 135°, and 157.5° with respect to the 200 MHz rescaled user clock, while the fractional phases for copy 1 of the logic region 1880 is thus 180°, 202.5°, 225°, 247.5°, 270°, 292.5°, 315°, and 337.5° with respect to the 200 MHz rescaled user clock. (The example resealing operation illustrated in FIG. 18 has a rescaling factor of k=2; copy 0 of the logic region has the index i=0; and copy 1 of the logic region has the index i=1.)

Even though the rescaled design is running at the 200 MHz rescaled user clock, some embodiments specify the fractional phases of the rescaled design with respect to the 400 MHz user clock. In these instances, as illustrated in FIG. 19, the fractional phases for the first configuration data set 1970 becomes 0°, 45°, 90°, 135°, 180°, 225°, 270°, and 315°, while the fractional phases for the second configuration data set 1980 becomes 360°, 405°, 450°, 495°, 540°, 585°, 630°, and 675°.

In some embodiments, the original configuration data set 1910 is never generated. In some of these embodiments, the rescaling operation transforms the original set of circuits into the rescaled set of circuits and directly generates configuration data sets 1970 and 1980 based on the rescaled set of circuits. In some other embodiments, the original configuration data set 1910 is generated first and the rescaling operation processes the configuration data set 1910 for generating the rescaled configuration data sets 1970 and 1980.

One of ordinary skill would recognize that the choice of frequencies, data rate, order of looperness, and rescaling factor discussed above by reference to FIGS. 18-19 are only illustrative examples. Other frequencies, data rates, orders of looperness, and rescaling factors could also be used. For example, to implement a 16-loopered scheme at 300 MHz data rate in an IC that only supports up to 800 MHz of clock rate, a rescaling operation can be performed with a rescaling factor of 6. In this example, each of the six replica sets of circuits can operate a 16-loopered scheme at 800 MHz and process data at 50 MHz data rate. The rescaled set of circuits will be able to support an overall data rate of 300 MHz (50 MHz×6) while maintaining logic density afforded by the 16-loopered scheme.

V. Rescaling during Physical Design of the IC

Rescaling in some embodiments is undertaken during the design process of an IC. In some embodiments, after receiving an original design of an IC, the IC design process incorporates rescaling by applying the rescaling operation to at least some of the circuits in the IC and producing a new design for the IC. In some embodiments, the rescaling operation is performed as part of a physical design process that produces a physical design for the IC.

A physical design of an IC is a specification of the IC that can be used to manufacture or configure an IC. In some embodiments, such a specification can include identifications of circuit components and interconnections, descriptions of the behaviors of the IC, specifications of the types of circuit components to be used, specifications on placement of circuit components in the IC, and other specifications and descriptions that can be used in producing a complete physical design of the IC. For non-configurable circuits in an IC, a physical design may specify types of logic gates, locations of transistors, widths of interconnects, dimensions of semi-conducting materials, and other information needed for manufacturing the IC. For configurable circuits in an IC, a physical design may specify configuration data that can be loaded into the IC for configuring the configurable circuits to perform user defined operations.

In some embodiments, the physical design process is performed by a physical design tool. A physical design tool is a tool that transforms higher level descriptions of the IC (e.g., in a hardware description language such as Verilog, VHDL or SystemC) into lower level physical descriptions of the IC (e.g., in gate level netlists or physical layouts). A physical design tool can be one or a collection of tools that performs various phases of the physical design process, such as logic synthesis, timing closure, and place and route. In some embodiments, a physical design tool also receives information on various constraints and directives to be applied to the circuit during the physical design process such as scripts for synthesis and placement and route.

In some embodiments, the physical design process performs rescaling on the IC design according to a set of rescaling parameters. In some embodiments, such rescaling parameters include identifications of the set of circuits to be rescaled, a rescaling factor that specifies how many replica sets of circuits are to be included in the rescaled set of circuits, and a clock specification (e.g., frequency) for operating the rescaled set of circuits.

Figure 20:
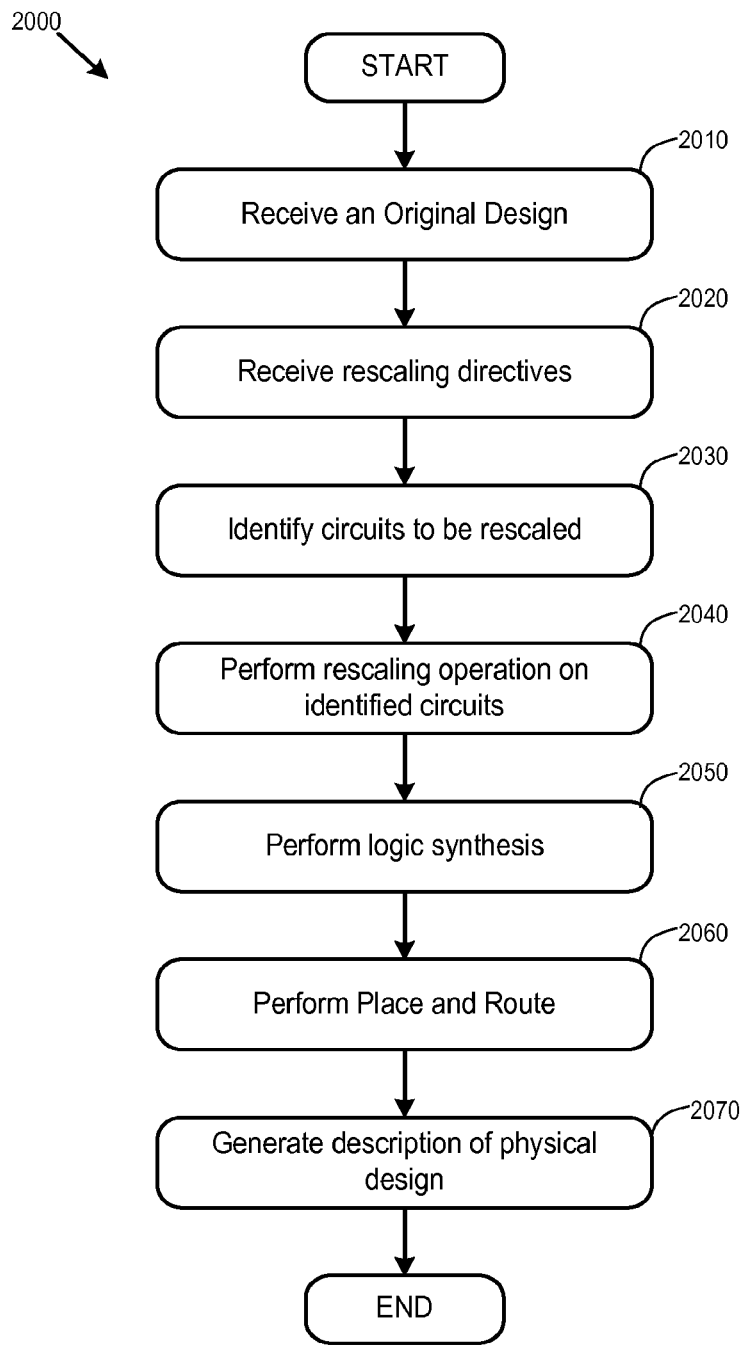
FIG. 20 conceptually illustrates an example process that can be performed by a physical design tool to implement rescaling of a circuit in an IC such as an ASIC or a FPGA.

For some of these embodiments, FIG. 20 conceptually illustrates an example process 2000 that can be performed by a physical design process or a physical design tool to implement rescaling. The process 2000 starts when the physical design tool receives a command to start a physical design process for the IC or a portion of the IC.

The process 2000 receives (at 2010) an original design of the IC. In some embodiments, the original design of the IC is in the form of a high level description (e.g., hardware description language) that describes the behavior of at least a portion of the IC. In some embodiments, the original design of the IC can also be in the form of a lower level description (such as a netlist) that expressly identifies at least some of the components and interconnections of the IC design. In some embodiments, the physical design tool processes the received original design of the IC by performing elaboration. Elaboration is a process in which the physical design tool creates a control-flow or data flow representation of the received design. Along with the original design of the IC, some embodiments of the physical design tool also receive physical design scripts and other required inputs to the physical design process.

The process next receives (at 2020) rescaling directives. For some of these embodiments, a directive to rescale a circuit can be text embedded in the high level behavioral description of the circuit, a GUI command to the physical design tool, a textual command embedded in a physical design script, or any other form of communication to the physical design tool executing process 2000. In some embodiments, the rescaling directives identify which groups of circuits are to be rescaled. In some of these embodiments, the rescaling directives also specify the rescaling factor and the frequency of the clock to be applied to the rescaled circuits.

After receiving the original design and the rescaling directives, the process identifies (at 2030) the set of circuits in the design to be rescaled by using the rescaling directives received at 2020. The process next performs (at 2040) the rescaling operation on the set of circuits that have been identified as the set of circuits to be rescaled. In some embodiments, this rescaling operation is similar to the process 800, as described above by reference to FIG. 8.

For some embodiments that perform elaboration, the process first identifies the set of circuits to be rescaled in the elaborated design and then performs rescaling on the identified set of circuits. For some embodiments that receive an original design in which some or all of the circuits are described by a lower level description (such as a netlist), the identifying step of 2030 can include express identification of components and interconnections in the netlist, and the rescaling step of 2040 is then performed based on the identified components and interconnections. The rescaling operation in some embodiments produces a description of the IC design in which the identified set of circuits has been rescaled. This description of the IC design produced after the rescaling operation can be in the form of an elaborated design, a high level description, a netlist, or another representation of the IC.

The process next performs (at 2050) logic synthesis on the description of the IC design. Logic synthesis is an operation by which the physical design tool transforms higher level descriptions (e.g., HDL or elaborated design) of the IC design into lower level descriptions of the IC design (e.g., netlist) by transforming the higher level description of the rescaled IC design (e.g., HDL or elaborated design) into a lower level description of the IC design (e.g., netlist). In some embodiments, the synthesis operation also performs logical, timing, or area optimizations before producing a synthesized netlist that includes the rescaled set of circuits.

Next, the process 2000 performs (at 2060) place and route using the synthesized netlist. In some embodiments, this operation includes placing transistors and/or gates in the IC and routing interconnections among the transistors and/or gates. For embodiments that apply resealing to circuits with configurable circuits, this operation includes mapping gates and interconnections to configurable logic circuits and configurable interconnect circuits. For some of these embodiments in which some or all of the configurable circuits are real-time reconfigurable circuits, the placement and route operation may include mapping the rescaled set of circuits at different phases of the clock to different configuration data entries, as discussed above by reference to FIG. 13.

The process next generates (at 2070) a description of the physical design of the IC. In some embodiments, the generated description of the physical design includes the location, the layer identification, and the dimensions of conducting (e.g., metallic wires) and semiconducting (e.g., n-wells and p-wells) materials. For some embodiments that include configurable or reconfigurable circuits, this operation generates a set of configuration data for configuring or reconfiguring the configurable circuits, as described above in Section II.

One of ordinary skill would recognize that a physical design process for performing rescaling would not need to be performed in the order of the steps illustrated in FIG. 20. For example, the steps 2030 (identification) and 2040 (rescaling) could be performed after 2050 (synthesis). In some of these embodiments, the synthesis step 2050 is performed first in order to produce a synthesized netlist, and the rescaling step 2040 is performed on the synthesized netlist.

VI. Configurable IC and System

Some embodiments described above are implemented in configurable ICs that can compute configurable combinational digital logic functions on signals that are presented on the inputs of the configurable ICs. In some embodiments, such computations are stateless computations (i.e., do not depend on a value of a previous state). Some embodiments described above are implemented in configurable ICs that can perform a continuous function. In these embodiments, the configurable IC can receive a continuous function at its input, and in response, provide a continuous output at one of its outputs.

Figure 21:
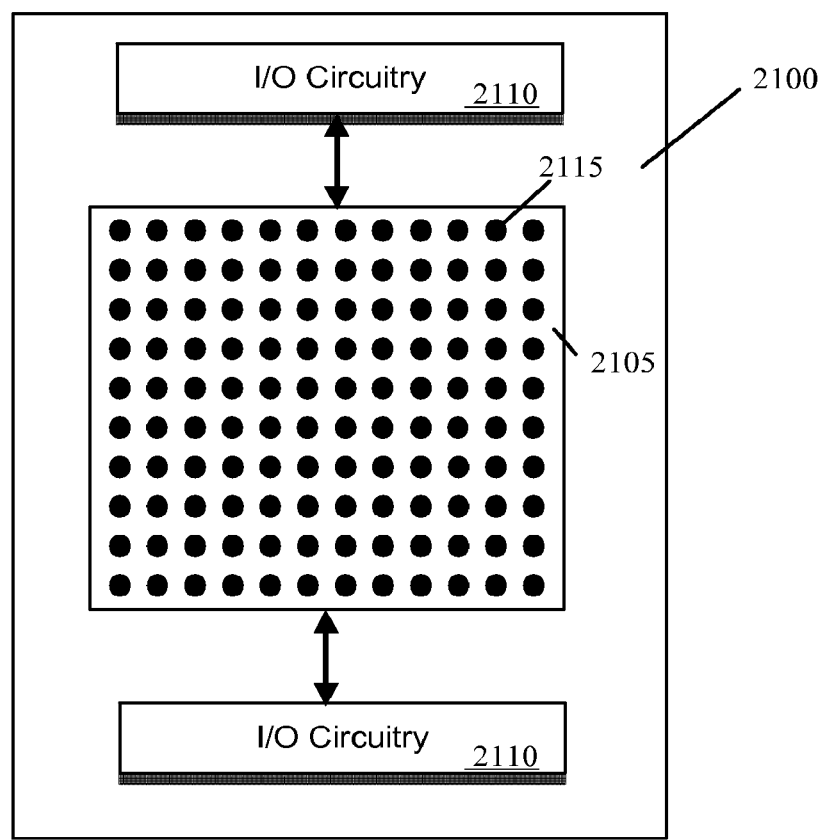
FIG. 21 illustrates a portion of a configurable IC of some embodiments of the invention.

FIG. 21 illustrates a portion of a configurable IC 2100 of some embodiments of the invention. As shown in this figure, this IC has a configurable circuit arrangement 2105 and I/O circuitry 2110. The configurable circuit arrangement 2105 can include any of the above described circuits, storage elements, and routing fabric of some embodiments of the invention. The I/O circuitry 2110 is responsible for routing data between the configurable nodes 2115 of the configurable circuit arrangement 2105 and circuits outside of this arrangement (i.e., circuits outside of the IC, or within the IC but outside of the configurable circuit arrangement 2105). As further described below, such data includes data that needs to be processed or passed along by the configurable nodes.

Figure 22:
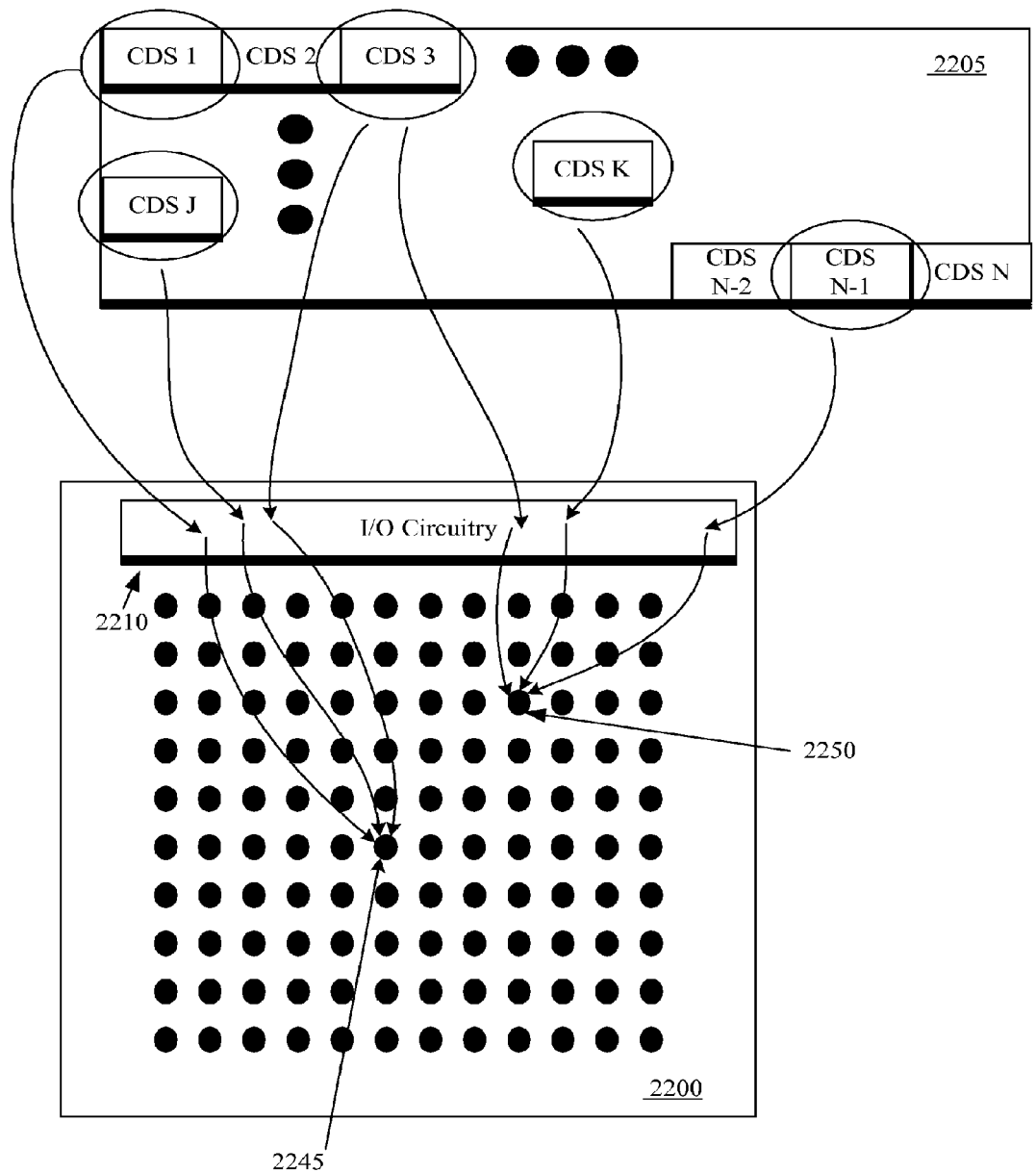
FIG. 22 illustrates a more detailed example of a set of configuration data that configures nodes to perform particular operations.

The data also includes, in some embodiments, a set of configuration data for configuring the nodes to perform particular operations. FIG. 22 illustrates a detailed example of this. Specifically, this figure illustrates a configuration data pool 2205 for the configurable IC 2200. This pool includes N configuration data sets ("CDS"). As shown in FIG. 22, the I/O circuitry 2210 of the configurable IC 2200 routes different configuration data sets to different configurable nodes of the IC 2200. For instance, FIG. 22 illustrates configurable node 2245 receiving configuration data sets 1, 3, and J, through the I/O circuitry, while configurable node 2250 receives configuration data sets 3, K, and N−1, through the I/O circuitry. In some embodiments, the configuration data sets are stored within each configurable node. Also, in some embodiments, a configurable node can store multiple configuration data sets for a configurable circuit so that the circuit can reconfigure quickly by changing to another configuration data set for a configurable circuit. In some embodiments, some configurable nodes store only one configuration data set, while other configurable nodes store multiple configuration data sets for a configurable circuit.

Figure 23:
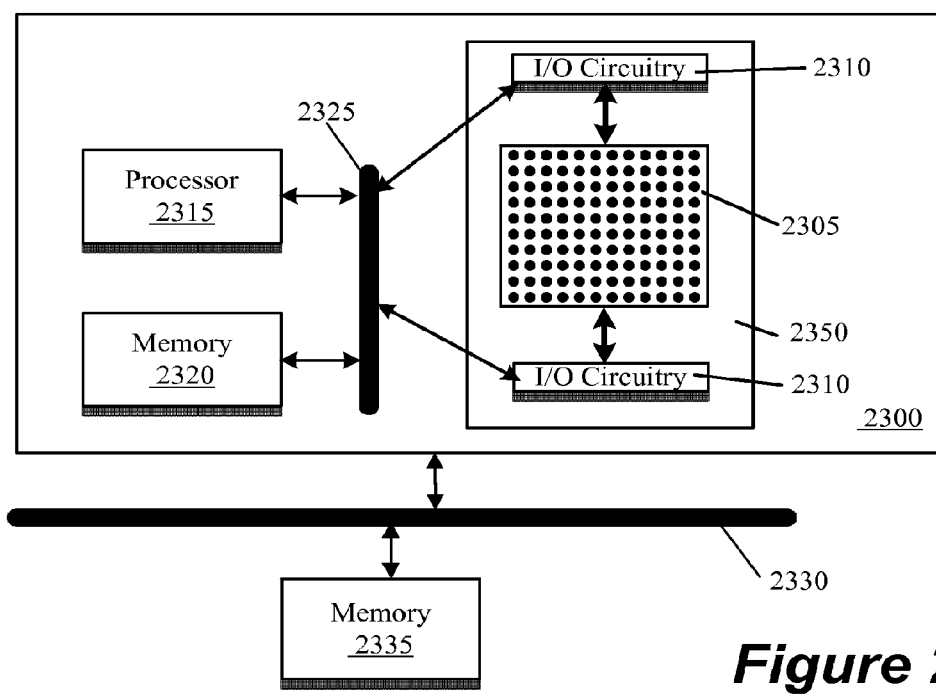
FIG. 23 illustrates a system on chip ("SoC") implementation of a configurable IC.

A configurable IC of the invention can also include circuits other than a configurable circuit arrangement and I/O circuitry. For instance, FIG. 23 illustrates a system on a chip ("SoC") implementation of a configurable IC 2300. This IC has a configurable block 2350, which includes a configurable circuit arrangement 2305 and I/O circuitry 2310 for this arrangement. It also includes a processor 2315 outside of the configurable circuit arrangement, a memory 2320, and a bus 2325, which conceptually represents all conductive paths between the processor 2315, memory 2320, and the configurable block 2350. As shown in FIG. 23, the IC 2300 couples to a bus 2330, which communicatively couples the IC to other circuits, such as an off-chip memory 2335. Bus 2330 conceptually represents all conductive paths between the system components.

The processor 2315 can read and write instructions and/or data from an on-chip memory 2320 or an off-chip memory 2335. The processor 2315 can also communicate with the configurable block 2350 through memory 2320 and/or 2335 through buses 2325 and/or 2330. Similarly, the configurable block can retrieve data from and supply data to memories 2320 and 2335 through buses 2325 and 2330.

Figure 24:
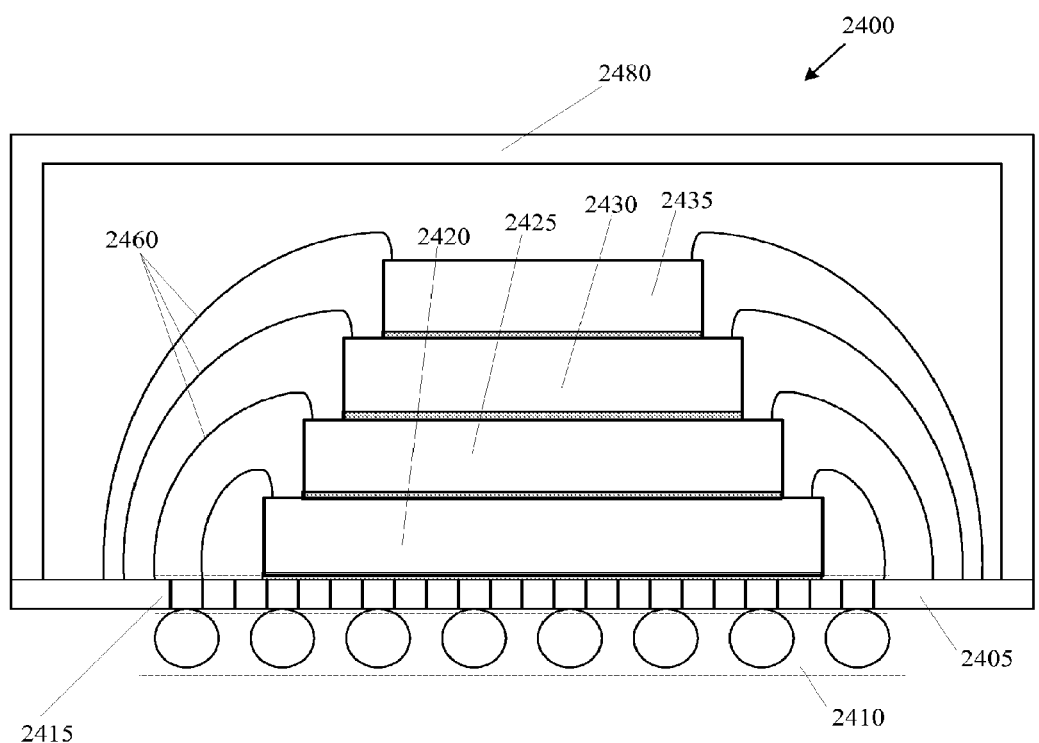
FIG. 24 illustrates a system in package ("SiP") implementation of a configurable IC.

Instead of, or in conjunction with, the system on a chip ("SoC") implementation for a configurable IC, some embodiments might employ a system in a package ("SiP") implementation for a configurable IC. FIG. 24 illustrates one such SiP 2400. As shown in this figure, SiP 2400 includes four ICs 2420, 2425, 2430, and 2435 that are stacked on top of each other on a substrate 2405. At least one of the ICs is a configurable IC that includes a configurable block, such as the configurable block 2350 of FIG. 23. Other ICs might be other circuits, such as processors, memory, etc.

As shown in FIG. 24, the IC communicatively connects to the substrate 2405 through wire bondings 2460. These wire bondings 2460 allow the ICs 2420-2435 to communicate with each other without having to go outside of the SiP 2400. In some embodiments, the ICs 2420-2435 might be directly wire-bonded to each other in order to facilitate communication between the ICs. Instead of, or in conjunction with, the wire bondings 2460, some embodiments might use other mechanisms to communicatively couple the ICs 2420-2435 to each other.

As further shown in FIG. 24, the SiP includes a ball grid array ("BGA") 2410 and a set of vias 2415. The BGA 2410 is a set of solder balls that allows the SiP 2400 to be attached to a printed circuit board ("PCB"). Each via connects a solder ball in the BGA 2410 on the bottom of the substrate 2405, to a conductor on the top of the substrate 2405.

The conductors on the top of the substrate 2405 are electrically coupled to the ICs 2420-2435 through the wire bondings 2460. Accordingly, the ICs 2420-2435 can send and receive signals to and from circuits outside of the SiP 2400 through the wire bondings 2460, the conductors on the top of the substrate 2405, the set of vias 2415, and the BGA 2410. Instead of a BGA, other embodiments might employ other structures (e.g., a pin grid array) to connect a SiP to circuits outside of the SiP. As shown in FIG. 24, a housing 2480 encapsulates the substrate 2405, the BGA 2410, the set of vias 2415, the ICs 2420-2435, and the wire bondings 2460 to form the SiP 2400. This and other SiP structures are further described in U.S. Pat. No. 7,530,044 entitled "Method for Manufacturing a Programmable System In Package", which is incorporated herein by reference.

Figure 25:
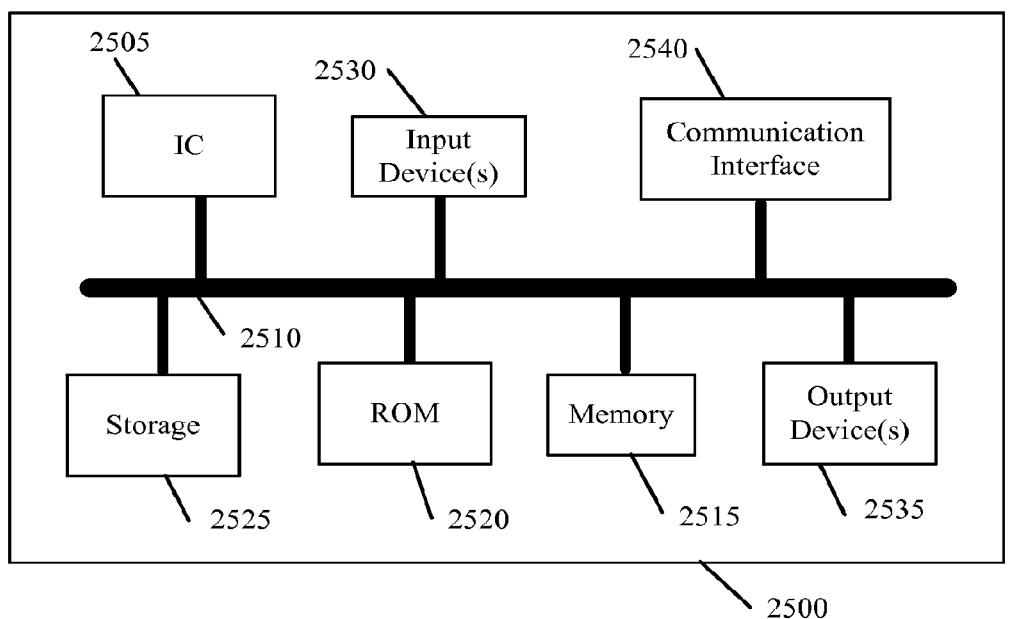
FIG. 25 conceptually illustrates an example of a computing system.

FIG. 25 conceptually illustrates a more detailed example of a computing system 2500 that has an IC 2505, which includes a configurable circuit arrangement with configurable circuits, storage elements, and routing fabric of some embodiments of the invention that are described above. The system 2500 can be a stand-alone computing or communication device, or it can be part of another electronic device. As shown in FIG. 25, in addition to the IC 2505, the system 2500 also includes a bus 2510, a system memory 2515, a read-only memory 2520, a storage device 2525, input device(s) 2530, output device(s) 2535, and a communication interface 2540.

The bus 2510 collectively represents all system, peripheral, and chipset interconnects (including bus and non-bus interconnect structures) that communicatively connect the numerous internal devices of the system 2500. For instance, the bus 2510 communicatively connects the IC 2505 with the read-only memory 2520, the system memory 2515, and the permanent storage device 2525. The bus 2510 may be any of several types of bus structures including a memory bus or memory controller, a peripheral bus, and a local bus using any of a variety of conventional bus architectures. For instance, the bus 2510 architecture may include any of the following standard architectures: PCI, PCI-Express, VESA, AGP, Microchannel, ISA and EISA, to name a few.

From these various memory units, the IC 2505 receives data for processing and configuration data for configuring the configurable logic and/or interconnect circuits of the IC. When the IC 2505 has a processor, the IC also retrieves, from the various memory units, instructions to execute. The read-only-memory (ROM) 2520 stores static data and instructions that are needed by the IC 2505 and other modules of the system 2500.

Some embodiments of the invention use a mass-storage device (such as a magnetic disk to read from or write to a removable disk, or an optical disk for reading a CD-ROM disk or to read from or write to other optical media) as the permanent storage device 2525. Other embodiments use a removable storage device (such as a flash memory card or memory stick) as the permanent storage device 2525. The drives and their associated computer-readable media provide non-volatile storage of data, data structures, computer-executable instructions, etc. for the system 2500. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 2525, the system memory 2515 is a read-and-write memory device. However, unlike storage device 2525, the system memory is a volatile read-and-write memory, such as a random access memory. Typically, system memory 2515 may be found in the form of random access memory (RAM) modules such as SDRAM, DDR, RDRAM, and DDR-2. The system memory stores some of the sets of instructions and data that the processor needs at runtime.

The bus 2510 also connects to the input and output devices 2530 and 2535. The input devices 2530 enable the user to enter information into the system 2500. The input devices 2530 can include touch-sensitive screens, keys, buttons, keyboards, cursor-controllers, touch screen, joystick, scanner, microphone, etc. The output devices 2535 display the output of the system 2500. The output devices 2535 include printers and display devices, such as cathode ray tubes (CRT), liquid crystal displays (LCD), organic light emitting diodes (OLED), plasma, projection, etc.

Finally, as shown in FIG. 25, bus 2510 also couples system 2500 to other devices through a communication interface 2540. Examples of the communication interface 2540 include network adapters that connect to a network of computers, or wired or wireless transceivers for communicating with other devices. Through the communication interface 2540, the system 2500 can be a part of a network of computers (such as a local area network ("LAN"), a wide area network ("WAN"), or an Intranet) or a network of networks (such as the Internet). The communication interface 2540 may provide such connection using wireless techniques, including digital cellular telephone connection, Cellular Digital Packet Data (CDPD) connection, digital satellite data connection, or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. A computer readable storage medium storing a program that is executable by at least one processor, the program for designing an integrated circuit (IC), wherein a design of the IC comprises an original set of circuits operating on a particular clock including a set of sequential nodes, a set of combinational nodes and a set of interconnections, the computer program comprising sets of instructions for:

generating a rescaled set of circuits comprising a plurality of logically equivalent replica sets of circuits, wherein each replica set of circuits comprises (i) a set of combinational nodes that is logically equivalent to the set of combinational nodes in the original set of circuits and (ii) a set of sequential nodes having inputs from another replica set of circuits that are logically equivalent to inputs of the set of sequential nodes in the original set of circuits, wherein each replica set of circuits operates at a different phase of the particular clock; and replacing the original set of circuits in the design of the IC with the rescaled set of circuits.

2. The computer readable storage medium of claim 1, wherein the plurality of replica sets of circuits comprises N replica sets of circuits, wherein N is an integer greater than 1.

3. The computer readable storage medium of claim 2, wherein the original set of circuits is specified to operate in a first frequency, the program further comprising a set of instructions for specifying the plurality of replica sets of circuits to operate in a second frequency, wherein the second frequency is a fraction of the first frequency.

4. The computer readable storage medium of claim 3, wherein the second frequency is based on dividing the first frequency by N.

5. The computer readable storage medium of claim 2, wherein each sequential node in the original set of circuits is associated with a phase of the particular clock.

6. The computer readable storage medium of claim 5, wherein each sequential node in the rescaled set of circuits is associated with a fractional phase of the particular clock, the fractional phase being based on dividing the phase of the corresponding sequential node by N.

7. The computer readable storage medium of claim 1, wherein the plurality of replica sets of circuits comprises first and second replica sets of circuits, the set of instructions for generating the rescaled set of circuits further comprising sets of instructions for:

disconnecting a first sequential node in the first replica set of circuits from a first combinational node; and connecting the first sequential node to a second combinational node in the second replica set of circuits.

8. The computer readable storage medium of claim 7, wherein the second combinational node is logically equivalent to the first combinational node.

9. The computer readable storage medium of claim 7, wherein the first and second combinational nodes are logically equivalent to a particular combinational node in the original set of circuits, wherein the particular combinational node in the original set of circuits is connected to a particular sequential node in the original set of circuits, the particular sequential node having an input that is logically equivalent to an input to the first sequential node.

10. The computer readable storage medium of claim 1, wherein the rescaled set of circuits comprises k replica sets of circuits, each replica set of circuits in the rescaled set of circuits indexed by an integer between 0 and k−1, wherein a sequential node in the original set of circuits is associated with a phase $\phi$ and a corresponding sequential node in a replica set of circuits indexed i is associated with a phase $\phi'$, wherein $\phi'=(\phi+360°\times i)/k$.

11. The computer readable storage medium of claim 1, wherein the program further comprises a set of instructions receiving a set of parameters for generating said rescaled set of circuits.

12. The computer readable storage medium of claim 11, wherein the set of parameters comprises a rescaling factor for specifying a number of replica sets of circuits in the rescale set of circuits.

13. The computer readable storage medium of claim 12, wherein the set of parameters further comprises an identification of the original set of circuits in the design of the IC.

14. The computer readable storage medium of claim 13, wherein the set of parameters further comprises a specification of a frequency of a rescaled clock for the rescale set of circuits.

15. An integrated circuit ("IC") comprising:

a set of configurable circuits for implementing a rescaled set of circuits, the rescaled set of circuits comprising N logically equivalent replica sets of circuits, each replica set of circuits derived from an original set of circuits that is defined to operate at a user defined clock, each replica set of circuits comprising a set of storage elements that performs storage operations at one of N different phases of the user defined clock; and a set of configuration data storage for iteratively supplying one of N sets of configuration data to the set of configurable circuits, wherein each set of configuration data is for configuring the set of configurable circuits to perform the storage operations at one of the N different phases of the user defined clock.

16. The IC of claim 15, wherein each replica set of circuits is for performing functions that are replicated from an original set of functions that the original set of circuits is designed to perform.

17. The IC of claim 15, wherein the set of configuration data storage operate on a reconfiguration clock, wherein each phase of the user defined clock corresponds to a cycle of the reconfiguration clock.

18. The IC of claim 16, wherein a first replica set of circuits in the rescaled set of circuits comprises combinational nodes and sequential nodes that are logically equivalent to combinational nodes and sequential nodes in a second replica set of circuits in the rescaled set of circuits.

19. The IC of claim 18, wherein a plurality of the combinational nodes and sequential nodes in the first and second replica sets of circuits are implemented by configurable logic circuits and configurable interconnect circuits according to the N sets of configuration data stored in the set of configuration data storage.

20. The IC of claim 17, wherein the user defined clock is specified to operate at a first frequency and the reconfiguration clock is specified to operate at a second frequency, wherein the second frequency is a fraction of the first frequency.

21. The IC of claim 20, wherein the second frequency is based on dividing the first frequency by N.

22. An electronic device comprising:

an integrated circuit (IC) comprising:

a set of configurable circuits for implementing a rescaled set of circuits, the rescaled set of circuits comprising N logically equivalent replica sets of circuits, each replica set of circuits derived from an original set of circuits that is defined to operate at a user defined clock, each replica set of circuits comprises a set of storage element that perform storage operations at one of N different phases of the user defined clock; and a set of configuration data storage for iteratively supplying one of N sets of configuration data to the set of configurable circuits, wherein each set of configuration data is for configuring the set of configurable circuits to perform the storage operations at one of the N different phases of the user defined clock; and a memory device for providing the N sets of configuration data to the IC.

23. The electronic device of claim 22, wherein each replica set of circuits perform functions that are replicated from an original set of functions performed by the original set of circuits.

24. The electronic device of claim 22, wherein each replica set of circuits comprises (i) a set of combinational nodes that is logically equivalent to the set of combinational nodes in the original set of circuits and (ii) a set of sequential nodes having inputs that are logically equivalent to inputs of the set of sequential nodes in the original set of circuits.

25. The electronic device of claim 24, wherein each sequential node in the rescaled set of circuits is associated with a fractional phase of the user defined clock, the fractional phase being based on dividing the phase of the corresponding sequential node by N.

26. The electronic device of claim 22, wherein each replica set of circuits in the rescaled set of circuits is indexed by an integer between 0 and N-1, wherein a sequential node in the original set of circuits is associated with a phase $\phi$ and a corresponding sequential node in a replica set of circuits indexed i is associated with a phase $\phi'$, wherein $\phi'=(\phi+360°\times i)/N$.

* * * * *